United States Patent
Motoi et al.

(10) Patent No.: US 9,319,255 B2
(45) Date of Patent: Apr. 19, 2016

(54) TRANSMITTER, SIGNAL-SYNTHESIZING CIRCUIT, AND SIGNAL-SYNTHESIZING METHOD

(71) Applicant: NEC Corporation, Tokyo (JP)

(72) Inventors: Keiichi Motoi, Tokyo (JP); Shinichi Hori, Tokyo (JP); Kazumi Shiikuma, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 14/420,440

(22) PCT Filed: Sep. 12, 2013

(86) PCT No.: PCT/JP2013/074613
§ 371 (c)(1),
(2) Date: Feb. 9, 2015

(87) PCT Pub. No.: WO2014/042205
PCT Pub. Date: Mar. 20, 2014

(65) Prior Publication Data
US 2015/0222461 A1    Aug. 6, 2015

(30) Foreign Application Priority Data

Sep. 14, 2012    (JP) .................... 2012-202591
Feb. 4, 2013     (JP) .................... 2013-019538

(51) Int. Cl.
*H04L 27/04* (2006.01)
*H03F 3/24* (2006.01)
(Continued)

(52) U.S. Cl.
CPC ............... *H04L 27/04* (2013.01); *H03F 1/565* (2013.01); *H03F 3/2173* (2013.01);
(Continued)

(58) Field of Classification Search
CPC .............. H04B 10/2575; H04B 2001/0408; H04B 1/0475; H04L 27/04; H04L 25/06; H03F 3/602; H03F 3/2178; H03F 3/2173; H03F 1/565; H03F 3/24
See application file for complete search history.

(56) References Cited

U.S. PATENT DOCUMENTS 5,578,971 A    11/1996  Minami et al.
5,930,128 A     7/1999  Dent
(Continued)

FOREIGN PATENT DOCUMENTS

EP    0 725 478 A1    8/1996
EP    2 602 930 A1    6/2013
(Continued)

OTHER PUBLICATIONS

Japanese Office Action issued by the Japan Patent Office for Application No. 2014-535582 dated Jul. 7, 2015 (2 pages).
(Continued)

*Primary Examiner* — Vineeta Panwalkar
(74) *Attorney, Agent, or Firm* — Wilmer Cutler Pickering Hale and Dorr LLP

(57) ABSTRACT

A transmitter includes: a modulation circuit for modulating a baseband signal into a multi-bit digital signal containing a radio frequency band component; a plurality of switch mode amplifiers each provided corresponding to a respective bit of the multi-bit digital signal supplied from the modulation circuit; and a signal-synthesizing circuit. The signal-synthesizing circuit connects a band-restricting unit that restricts the band of the output signals of the plurality of switch mode amplifiers and a voltage-current conversion unit that converts output signals of the switch mode amplifiers from voltage into current to perform signal synthesizing.

31 Claims, 28 Drawing Sheets

(51) Int. Cl.

| | | |
|---|---|---|
| *H03F 1/56* | (2006.01) | |
| *H03F 3/217* | (2006.01) | |
| *H03F 3/60* | (2006.01) | |
| *H04B 1/04* | (2006.01) | |
| *H04L 25/06* | (2006.01) | |

(52) U.S. Cl.
CPC ............... *H03F 3/2178* (2013.01); *H03F 3/24* (2013.01); *H03F 3/602* (2013.01); *H04B 1/0475* (2013.01); *H04L 25/06* (2013.01); *H04B 2001/0408* (2013.01)

(56) References Cited

U.S. PATENT DOCUMENTS

| | | |
|---|---|---|
| 2008/0290938 A1 | 11/2008 | Gupta et al. |
| 2013/0142283 A1 | 6/2013 | Hori |

FOREIGN PATENT DOCUMENTS

| | | |
|---|---|---|
| JP | S62-245733 A | 10/1987 |
| JP | H07-086812 A | 3/1995 |
| JP | H08-204456 A | 8/1996 |
| JP | 2003-092515 A | 3/2003 |
| JP | 2003-179445 A | 6/2003 |
| JP | 2003-304127 A | 10/2003 |
| JP | 2006-067176 A | 3/2006 |
| JP | 2007-509583 A | 4/2007 |
| JP | 2010-041271 A | 2/2010 |
| JP | 2010-213062 A | 9/2010 |
| JP | 2011-077979 A | 4/2011 |
| JP | 2011-091757 A | 5/2011 |
| WO | WO-2011/078120 A1 | 6/2011 |
| WO | WO-2012/017580 A1 | 2/2012 |

OTHER PUBLICATIONS

Japanese Office Action issued by the Japan Patent Office for Japanese Application No. 2014-535582 dated Sep. 8, 2015 (2 pages).

International Search Report corresponding to PCT/JP2013/074613, dated Nov. 5, 2013 (3 pages).

Jinseong Jeong, Yuanxun Ethan Wang, "A Polar Delta-Sigma Modulation (PDSM) Scheme for High Efficiency Wireless Transmitters," Microwave Symposium, 2007. IEEE/MTT-S International, Jun. 2007, pp. 73-76.

Shinichi Hori, et al., "A 0.3-3 GHz Reconfigurable Digital Transmitter with Multi-bit Envelope ΔΣ Modulator Using Phase-Modulated Carrier Clock for Wireless Sensor Networks," Radio Frequency Integrated Circuits Symposium (RFIC), 2012 IEEE, Jun. 17-19, 2012, pp. 105-108.

Hualiang Zhang, Kevin J. Chen, "A Stub Tapped Branch-Line Coupler for Dual-Band Operations," IEEE Microwave and Wireless Components Letters, vol. 17, No. 2, Feb. 2007, pp. 106-108.

Paolo Colantonio, et al., "Design of a Dual-Band GaN Doherty Amplifier," 18th International Conference on Microwave Radar and Wireless Communications (MIKON), 2010 Publication Year 2010, pp. 1-4.

- In identical code input, the identical pulse thinning code is supplied to two amplifiers.

US 9,319,255 B2

TRANSMITTER, SIGNAL-SYNTHESIZING CIRCUIT, AND SIGNAL-SYNTHESIZING METHOD

CROSS-REFERENCE TO RELATED APPLICATIONS

This application is a national stage application of International Application No. PCT/JP2013/074613 entitled "Transmitter, Signal-Synthesizing Circuit, and Signal-Synthesizing Method," filed on Sep. 12, 2013, which claims the benefit of the priority of Japanese Patent Application No. 2012-202591, filed on Sep. 14, 2012, and Japanese Patent Application No. 2013-019538, filed on Feb. 4, 2013, the disclosures of each of which are hereby incorporated by reference in their entirety.

TECHNICAL FIELD

The present invention relates to a technology of synthesizing output signals of a plurality of switch-mode amplifiers, and more particularly relates to a technology of synthesizing a multi-bit digital signal of radio frequency following amplification of the multi-bit digital signal by a plurality of switch-mode amplifiers.

BACKGROUND ART

A base station of a radio communication system transmits signals having large differences between average power and peak power. In recent years, as means for achieving higher efficiency of transmission amplifiers that are used in the transmitters of such base stations, digital transmitters are being investigated that convert a transmission signal to a radio-frequency digital transmission signal and then amplify the signal, and switch-mode amplifiers such as class-D amplifiers or class-S amplifiers are being investigated as amplifiers. Assuming that the input signal is a pulse waveform signal, a switch-mode amplifier amplifies power while maintaining the pulse shape without alteration. The pulse waveform signal that has been amplified by a switch-mode amplifier is supplied from the digital transmitter after frequency components other than the band of the desired radio signal have been removed.

In addition, raising the purity and quality of the transmission signal necessitates conversion of a digital transmission signal to multi-bit signal.

As a means for raising the purity and quality of the transmission signal, a means is considered that, in order to support the conversion of a digital transmission signal to a multi-bit signal, provides a plurality of switch-mode amplifiers each corresponding to a respective bit of the plurality of bits of the digital transmission signal and that finally synthesizes the output signals of the plurality of switch-mode amplifiers to supply the synthesized signal to load.

However, none of Patent Documents 1 and 2 and Non-Patent Documents 1 and 2 that relate to transmitters that use switch-mode amplifiers discloses an actual signal-synthesizing circuit that synthesizes the output signals of a plurality of switch-mode amplifiers.

LITERATURE OF THE PRIOR ART

Patent Documents

Patent Document 1: Japanese Unexamined Patent Application Publication No. 2011-077979

Patent Document 2: International Publication No. 2011/078120 Non-Patent Documents Non-Patent Document 1: Jinseong Jeong, Yuanxun Ethan Wang, "A Polar Delta-Sigma Modulation (PDSM) Scheme for High Efficiency Wireless Transmitters," Microwave Symposium, 2007. IEEE/MTT-S International, June 2007, pp. 73-76

Non-Patent Document 2: Shinichi Hori, et al., "A 0.3-3 GHz Reconfigurable Digital Transmitter with Multi-bit Envelope $\Delta\Sigma$ Modulator Using Phase-Modulated Carrier Clock for Wireless Sensor Networks," Radio Frequency Integrated Circuits Symposium (RFIC), 2012 IEEE, Jun. 17-19, 2012, pp. 15-108

SUMMARY OF THE INVENTION

Problem to be Solved by the Invention

As described hereinabove, Patent Documents 1 and 2 and Non-Patent Documents 1 and 2 make no disclosure of the actual signal-synthesizing circuit that synthesizes the output signals of a plurality of switch-mode amplifiers.

It is therefore an object of the present invention to realize a signal-synthesizing circuit that synthesizes the output signals of a plurality of switch-mode amplifiers and solves the above-described problem.

Means for Solving the Problem

The transmitter of the present invention includes:

a modulation circuit that modulates a baseband signal into a multi-bit digital signal that contains a radio-frequency band component;

a plurality of switch-mode amplifiers each provided corresponding to a respective bit of the multi-bit digital signal that is supplied from the modulation circuit; and a signal-synthesizing circuit that connects a band-restricting unit that restricts the band of the output signals of the plurality of switch-mode amplifiers and a voltage-current conversion unit that converts the output signals of the switch-mode amplifiers from voltage to current to perform signal synthesizing.

The signal-synthesizing circuit of the present invention includes:

a band-restricting unit that restricts the band of the output signals of the plurality of switch-mode amplifiers that are each provided corresponding to a respective bit of a multi-bit digital signal; and a voltage-current conversion unit that converts the output signals of the switch-mode amplifiers from voltage to current;

wherein the signal-synthesizing circuit connects the band-restricting unit and the voltage-current conversion unit to perform signal synthesizing.

The signal synthesizing method of the present invention provides, in a signal-synthesizing circuit:

a band-restricting unit that restricts the band of the output signals of a plurality of switch-mode amplifiers that are each provided corresponding to a respective bit of a multi-bit digital signal; and a voltage-current conversion unit that converts output signals of the switch-mode amplifiers from voltage to current;

wherein the signal-synthesizing circuit connects the band-restricting unit and the voltage-current conversion unit to perform signal synthesizing.

Effect of the Invention

The present invention obtains the effects of enabling the actualization of a signal-synthesizing circuit that synthesizes output signals of a plurality of switch-mode amplifiers.

BEST MODE FOR CARRYING OUT THE INVENTION

Exemplary embodiments of the present invention are next described with reference to the accompanying drawings.

Figure 1:
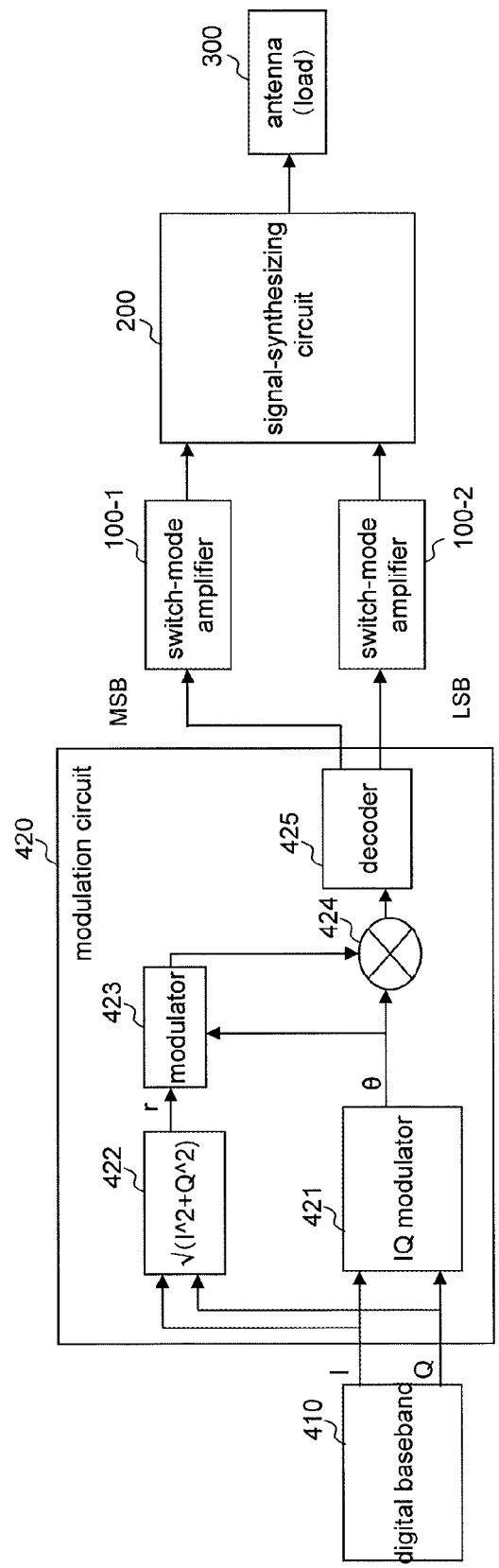
FIG. 1 shows the overall configuration of a transmitter of the present invention.

FIG. 1 shows an example of the overall configuration of a transmitter of the present invention.

If Wideband Code Division Multiple Access (W-CDMA) is taken as an example, radio signals are generated in Digital Baseband (hereinbelow abbreviated as "DBB") signal generation unit 410 as multi-bit DBB signals I and Q of 10 or more bits.

DBB signals I and Q are modulated into a multi-bit digital transmission signal that contains radio-frequency band components in modulation circuit 420. Modulation circuit 420 is made up of IQ modulator 421, converter 422, modulator 423, integrator 424, and decoder 425.

The number of bits that can be applied as input to a class-D amplifier is typically less than the number of bits of a DBB signal. Thus, in order to enable input of a DBB signal to a class-D amplifier, the number of bits must be decreased. According to a method in which the least significant bits are just discarded, quantization noise typically increases by 6 dB for each bit that is discarded. A Delta-Sigma ($\Delta\Sigma$) modulator that can be used as modulator 423 uses a circuit technology capable of decreasing the number of bits while avoiding increasing the quantization noise of bands in the vicinity of the desired frequency. However, a modulator other than a Delta-Sigma modulator may also be used as modulator 423.

DBB signals I and Q are applied as input to IQ modulator 421 and a pulse phase signal θ is generated that has been made rectangular in IQ modulator 421.

DBB signals I and Q are further applied as input to converter 422 and subjected to a $\sqrt{(I^2+Q^2)}$ operation in converter 422 to generate amplitude signal r.

Amplitude signal r is modulated in modulator 423. The number of bits of the output signal of modulator 423 is set equal to the number of bits that can be applied as input to the class-D amplifier of the succeeding section. In FIG. 1, two switch-mode amplifiers, 100-1 and 100-2, are provided as class-D amplifiers, and the number of bits that can be applied as input is therefore 2.

The output signal of modulator 423 is integrated with the pulse phase signal θ that was made rectangular in integrator 424 and a multi-bit digital transmission signal (two bits in FIG. 1) that contains a component of the desired radio frequency band is generated. Because "1" is assigned for high and "0" is assigned for low in the pulse phase signal θ that was made rectangular, the number of bits of the output signal of integrator 424 is equal to the number of bits of the output signal of modulator 423.

The digital transmission signal that is generated in integrator 424 is applied as input to switch-mode amplifiers 100-1 and 100-2 by way of decoder 425. In FIG. 1, the signal of the Most Significant Bit (MSB) side of this digital transmission signal is applied as input to switch-mode amplifier 100-1 and the signal of the Least Significant Bit (LSB) side is applied as input to switch-mode amplifier 100-2.

The output signals of these two switch-mode amplifiers 100-1 and 100-2 are synthesized in signal-synthesizing circuit 200, and this synthesized signal is then transmitted by way of antenna (load) 300.

Exemplary embodiments of signal-synthesizing circuit 200 are next described.

(1) First Exemplary Embodiment

Figure 2:
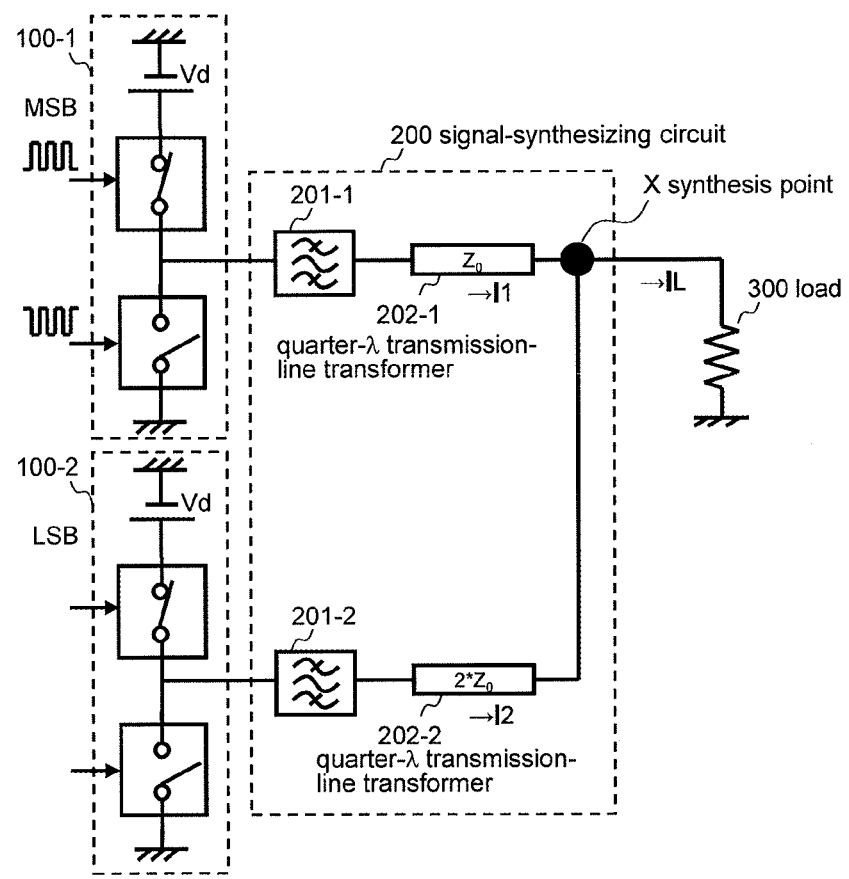
FIG. 2 shows the basic configuration of a signal-synthesizing circuit of the first exemplary embodiment of the present invention.
Figure 3:
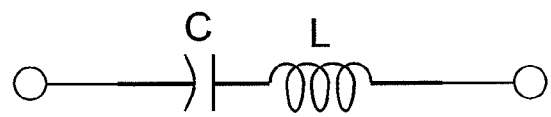
FIG. 3 shows an example of the configuration of a filter of the first exemplary embodiment of the present invention.

FIG. 2 shows the basic configuration of signal-synthesizing circuit 200 of the present exemplary embodiment.

As shown in FIG. 2, signal-synthesizing circuit 200 of the present exemplary embodiment synthesizes the output signal of switch-mode amplifier 100-1 that is provided and that corresponds to the MSB of a digital transmission signal and the output signal of switch-mode amplifier 100-2 that is provided and that corresponds to the LSB at synthesis point X and supplies the synthesized signal to load 300.

In signal-synthesizing circuit 200, filter 201-1 and quarter-wave transmission-line transformer 202-1 are provided on the signal path between switch-mode amplifier 100-1 and synthesis point X (first signal path—this term is similarly applied hereinbelow). In addition, filter 201-2 and quarter-wave transmission-line transformer 202-2 are provided on the signal path between switch-mode amplifier 100-2 and synthesis point X (second signal path—this term is similarly applied hereinbelow). In the case of this configuration, each of quarter-wave transmission-line transformers 202-1 and 202-2 constitutes the voltage-current conversion unit. In addition, each of filters 201-1 and 201-2 constitutes the band-restricting unit.

The operation on the MSB side is next described.

Switch-mode amplifier 100-1 is of a configuration in which two switch elements are inserted in series between the power source of power-source voltage Vd and ground and is controlled such that one of these two switch elements is ON.

As a result, the output voltage of switch-mode amplifier 100-1 is the power-source voltage Vd when the switch element on the power-source side is ON and the switch element on the ground side is OFF and is the ground potential in the reverse case. Therefore, in terms of high frequencies, this state is equivalent to grounding regardless of which state the switches are in, and the output of switch-mode amplifier 100-1 can therefore be considered to be a voltage source of low impedance.

Filter 201-1 restricts the band of the output signal of switch-mode amplifier 100-1 and therefore allows only a signal in the vicinity of the fundamental wave frequency to pass and reflects signals of other frequency domains. In particular, harmonic signals undergo total reflection.

As an example, an LC filter is used as filter 201-1, and more specifically, an LC series resonance circuit in which a capacitor and inductor are connected in series is preferably used.

Quarter-wave transmission-line transformer 202-1 converts the voltage of the output signal of filter 201-1 to current I1 and outputs it.

The operation on the LSB side is equivalent, and current I2 is supplied from quarter-wave transmission-line transformer 202-2.

Accordingly, synthesizing the currents of current I1 that is supplied from the MSB side and current I2 that is supplied from the LSB side at synthesis point X enables synthesizing the output signals of switch-mode amplifiers 100-1 and 100-2.

In this case, the characteristic impedances that are taken as the conversion coefficients when carrying out voltage-current conversion from voltage to current are different for quarter-wave transmission-line transformers 202-1 and 202-2 and are weighted according to the corresponding bits.

More specifically, in FIG. 2, the characteristic impedance of quarter-wave transmission-line transformer 202-1 is set to $Z_0$ and the characteristic impedance of quarter-wave transmission-line transformer 202-2 is set to $2*Z_0$.

Accordingly, currents I1 and I2 are weighted according to bit by means of the characteristic impedances of quarter-wave transmission-line transformers 202-1 and 202-2. As a result, the desired voltage synthesis waveform is obtained by supplying load 300 with current IL (=I1+I2) that is realized by synthesizing the current of these currents I1 and I2 at synthesis point X. Synthesis of a multi-bit digital transmission signal can thus be achieved at a radio frequency.

In addition, because the power-source voltages of switch-mode amplifiers 100-1 and 100-2 can be made the same type, a simpler and less costly power-source circuit can be achieved.

Signals other than the fundamental wave are reflected by filters 201-1 and 202-2 and are therefore not transmitted to load 300. As a result, higher efficiency of the transmission amplifier can be achieved. Still further, when viewed from load 300, the harmonic component is attenuated, whereby the spurious characteristics can be improved.

In addition, the impedance in the vicinity of the fundamental wave of the section preceding synthesis point X is established at the time of turning ON/OFF the switch elements of switch-mode amplifiers 100-1 and 100-2 and is low in terms of high frequency at the outputs of switch-mode amplifiers 100-1 and 100-2 regardless of the states of the switch elements and can therefore be considered to be the voltage source, whereby, due to the voltage-current conversion action of quarter-wave transmission-line transformers 202-1 and 202-2 that are connected in the succeeding section, signal-synthesizing circuit 200 becomes equivalent to a circuit in which the current source of current I1 and the current source of current I2 are connected at synthesis point X. As a result, isolation from other ports can be achieved at each port of synthesis point X.

Although the digital transmission signal was assumed to consist of two bits in the present exemplary embodiment, the present invention is not limited to this form and can be applied to multi-bit digital transmission signals.

Here, Table 1 shows an example of settings of the characteristic impedance of each of quarter-wave transmission-line transformers 202 that correspond to a multi-bit digital transmission signal when the power-source voltages of switch-mode amplifiers 100 are all identical and the characteristic impedance of quarter-wave transmission-line transformer 202 that corresponds to the MSB is made a reference $Z_0$.

TABLE 1

| Number of bits | MSB | | | | | LSB |
|---|---|---|---|---|---|---|
| 2 bits | $Z_0$ | absent | absent | absent | absent | $2*Z_0$ |
| 3 bits | $Z_0$ | absent | absent | absent | $2*Z_0$ | $4*Z_0$ |
| 4 bits | $Z_0$ | absent | absent | $2*Z_0$ | $4*Z_0$ | $8*Z_0$ |
| 5 bits | $Z_0$ | absent | $2*Z_0$ | $4*Z_0$ | $8*Z_0$ | $16*Z_0$ |
| 6 bits | $Z_0$ | $2*Z_0$ | $4*Z_0$ | $8*Z_0$ | $16*Z_0$ | $32*Z_0$ |
| n bits | $Z_0$ | $2*Z_0$ | omitted | omitted | $2^{(n-2)}*Z_0$ | $2^{(n-1)}*Z_0$ |

Table 2 shows an example of settings when the characteristic impedance of quarter-wave transmission-line transformer 202 that corresponds to the LSB is made a reference $Z_0$.

TABLE 2

| Number of bits | MSB | | | | | LSB |
|---|---|---|---|---|---|---|
| 2 bits | $Z_0/2$ | absent | absent | absent | absent | $Z_0$ |
| 3 bits | $Z_0/4$ | absent | absent | absent | $Z_0/2$ | $Z_0$ |
| 4 bits | $Z_0/8$ | absent | absent | $Z_0/4$ | $Z_0/2$ | $Z_0$ |
| 5 bits | $Z_0/16$ | absent | $Z_0/8$ | $Z_0/4$ | $Z_0/2$ | $Z_0$ |
| 6 bits | $Z_0/32$ | $Z_0/16$ | $Z_0/8$ | $Z_0/4$ | $Z_0/2$ | $Z_0$ |
| n bits | $Z_0/[2^{(n-1)}]$ | $Z_0/[2^{(n-2)}]$ | omitted | omitted | $Z_0/2$ | $Z_0$ |

Table 1 and Table 2 are examples in which the characteristic impedance of each quarter-wave transmission-line transformer 202 is set in binary divisions, i.e., equal divisions, but the present invention is not limited to this form, and the characteristic impedance can also be set in unequal divisions. In such cases as well, suitable division widths should be selected as appropriate according to the method of coding the transmission signal, the signal format, or statistical properties, but typically, L is set to increase with less significant bits.

Signal-synthesizing circuit 200 of the present exemplary embodiment is not limited to the configuration of FIG. 2 and is open to various modifications. Examples of modifications of signal-synthesizing circuit 200 of the present exemplary embodiment are next shown.

(1-1) Modification 1

Figure 4:
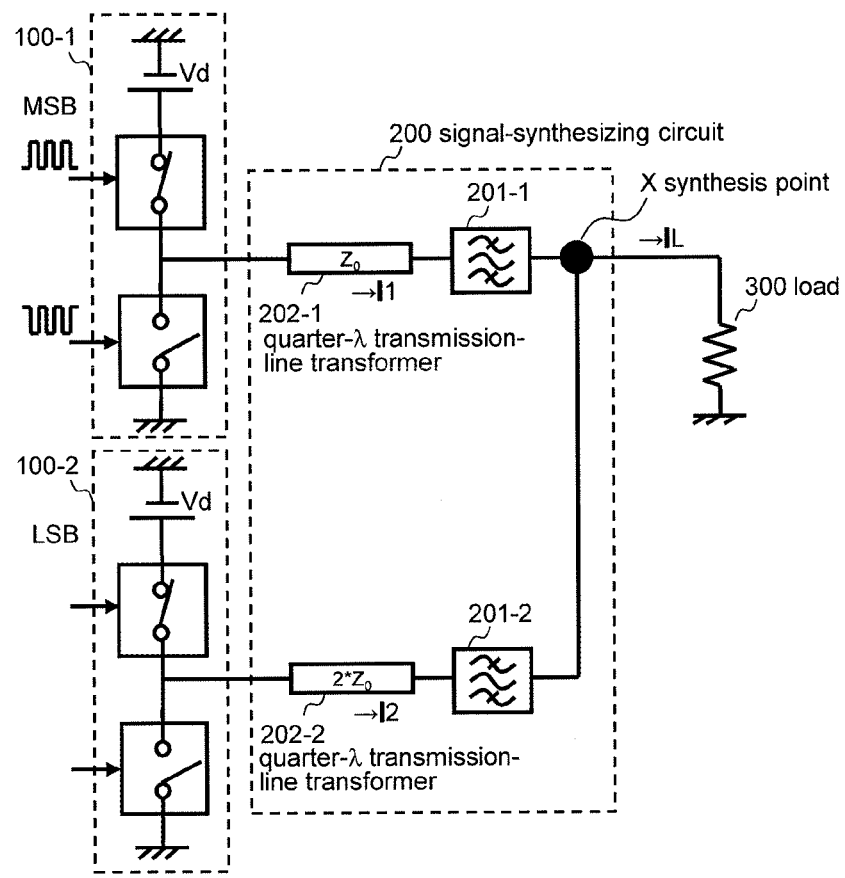
FIG. 4 shows the configuration of Modification 1 of the signal-synthesizing circuit of the first exemplary embodiment of the present invention.

FIG. 4 shows the configuration of Modification 1 of signal-synthesizing circuit 200 of the present exemplary embodiment.

As shown in FIG. 4, compared to the configuration of FIG. 2, Modification 1 both exchanges the positions of filter 201-1 and quarter-wave transmission-line transformer 202-1 and the positions of filter 201-2 and quarter-wave transmission-line transformer 202-2.

In the case of Modification 1 as well, signals other than the fundamental wave are reflected at filters 201-1 and 201-2 and are therefore not transmitted to load 300. As a result, not only can higher efficiency of transmission amplifiers be achieved, but the spurious characteristics can also be improved. The effects are otherwise the same as FIG. 2.

In the case of Modification 1, voltage-current conversion is carried out in the section preceding filters 201-1 and 201-2, and filters 201-1 and 201-2 are therefore equivalently connected to the current sources of currents I1 and I2, respectively.

Figure 5:
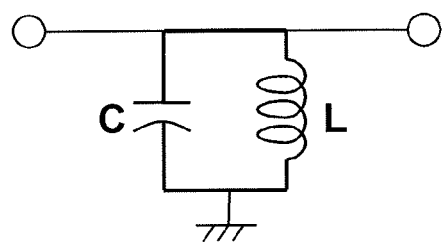
FIG. 5 shows an example of the configuration of a filter of the first exemplary embodiment of the present invention.

As a result, filters 201-1 and 201-2 preferably use LC parallel resonance circuits in which a capacitor and inductor are connected in parallel, as shown in FIG. 5.

Figure 6:
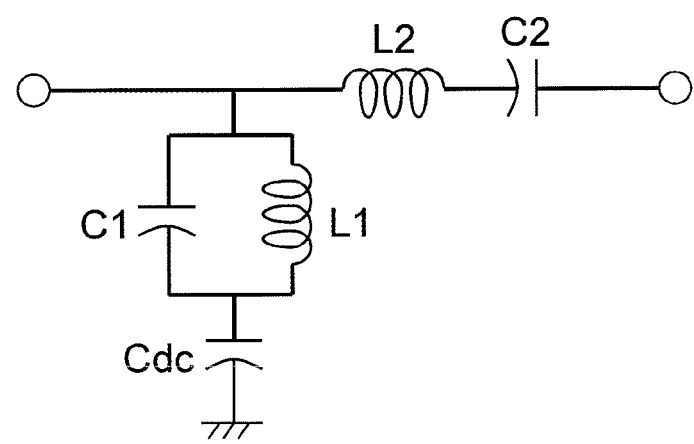
FIG. 6 shows an example of the configuration of a filter of the first exemplary embodiment of the present invention.

Alternatively, as shown in FIG. 6, filters 201-1 and 201-2 each preferably use a circuit made up of an LC series resonance circuit that is connected in series to the signal path and an LC parallel resonance circuit and capacitor that are connected in parallel to the signal path in the section preceding the LC series resonance circuit. In the case of this configuration, impedance in a harmonic component that is equal to or greater than 2f0 (where f0 is the fundamental wave frequency) when viewing the load 300 side from the output terminals of switch-mode amplifiers 100-1 and 100-2 is controlled near to open, whereby the ideal filter operation is approached and high-efficiency operation becomes possible. In addition, by causing an LC resonance circuit to operate at high load before converting impedance (before quarter-wave transmission-line transformer 202), the Q value of load 300 can be reduced and LC loss can be decreased even when using an easily installed inductor with an inductance of several nH. As a result, the circuit configuration of FIG. 6 enables high-efficiency operation of switch-mode amplifiers 100-1 and 100-2 due to both the low-loss impedance conversion in easily installed elements, and moreover, control of harmonics.

(1-2) Modification 2

Figure 7:
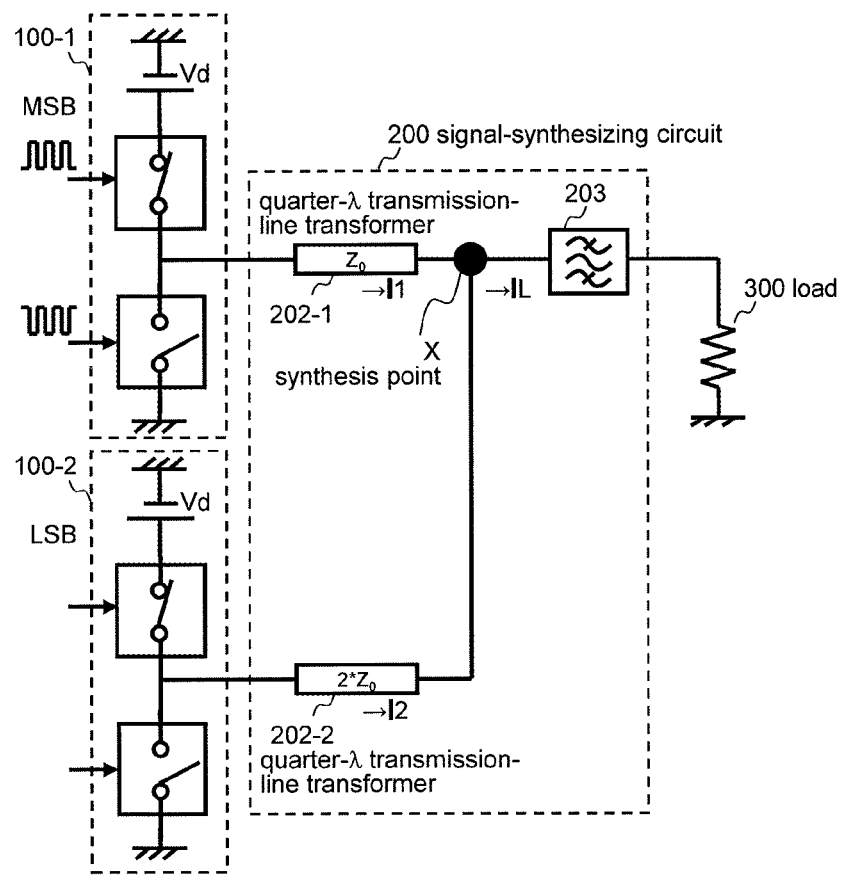
FIG. 7 shows the configuration of Modification 2 of the signal-synthesizing circuit of the first exemplary embodiment of the present invention.

FIG. 7 shows the configuration of Modification 2 of signal-synthesizing circuit 200 of the present exemplary embodiment.

As shown in FIG. 7, compared with the configuration of FIG. 2, Modification 2 eliminates filters 201-1 and 201-2, and in their place, provides filter 203 in the signal path (second signal path—this term is similarly applied hereinbelow) between synthesis point X and load 300. In the case of this configuration, filter 203 constitutes the band-restricting unit.

In the case of Modification 2 as well, signals other than the fundamental wave are reflected by filter 203 and are therefore not transmitted to load 300. As a result, not only can higher efficiency of the transmission amplifier be achieved, but the spurious characteristics can also be improved. The effects are otherwise the same as in FIG. 2.

In the case of Modification 2, filter 203 is equivalently connected to the current source of current IL (=I1+I2).

As a result, filter 203 preferably uses the LC parallel resonance circuit shown in FIG. 5 or FIG. 6.

(1-3) Modification 3

Increased pressure has been placed on recent transmitters to support multiband for amplifying and transmitting signals having a plurality of frequency bands.

Modification 3 is an example in which quarter-wave transmission-line transformer 202-1 shown in FIG. 2 is expanded to two bands corresponding to two frequencies.

Figure 8:
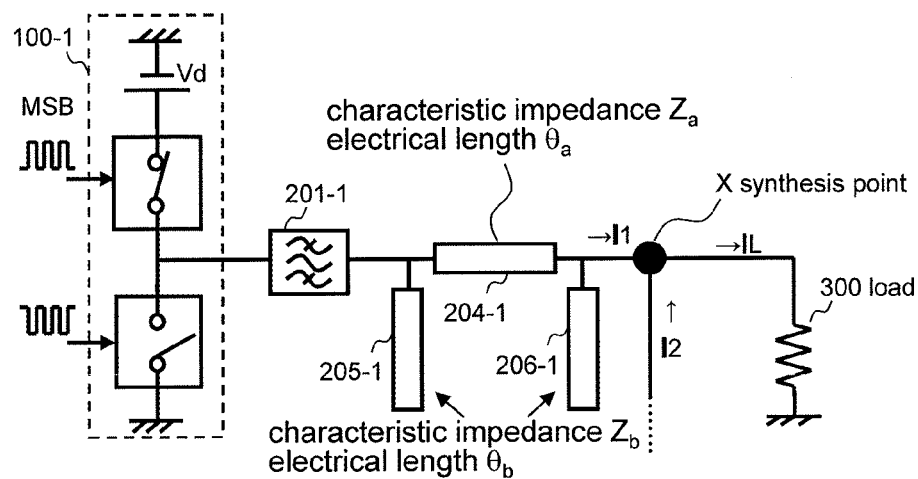
FIG. 8 shows the configuration of Modification 3 of the signal-synthesizing circuit of the first exemplary embodiment of the present invention.

FIG. 8 shows the configuration of Modification 3 of signal-synthesizing circuit 200 of the present exemplary embodiment. Although FIG. 8 shows only the configuration of the MSB side, the configuration of the LSB side is similar (the same is true for the following FIGS. 11, 12, and 13.)

As shown in FIG. 8, Modification 3 provides transmission line 204-1 and open stubs 205-1 and 206-1 as the equivalent circuit when quarter-wave transmission-line transformer 202-1 shown in FIG. 2 is expanded to two bands. In the case of this configuration, voltage-current conversion unit is made up of transmission line 204-1 and open stubs 205-1 and 206-1.

To state in greater detail, in the case of Modification 3, transmission line 204-1 is connected in series to the signal path, and open stubs 205-1 and 206-1 are connected in parallel to the signal path, each at a respective end of the two ends of transmission path 204-1.

In addition, in the case of Modification 3, transmission line 204-1 has characteristic impedance $Z_a$ and electrical length $\theta_a$, and open stubs 205-1 and 206-1 have characteristic impedance $Z_b$ and electrical length $\theta_b$, these constants $Z_a$, $\theta_a$, $Z_b$, and $\theta_b$ being set to carry out voltage-current conversion at two frequencies.

Figure 9:
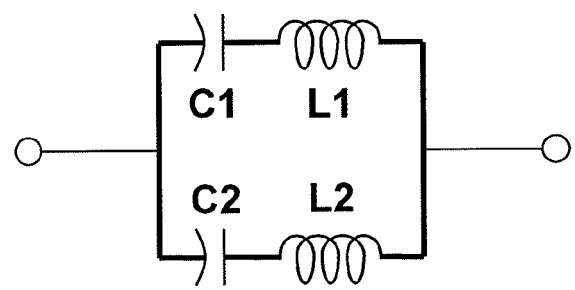
FIG. 9 shows an example of the configuration of a filter of the first exemplary embodiment of the present invention.

In the case of Modification 3, filter 201-1 provided in the section preceding open stub 205-1 can also be expanded to two bands. In this case, filter 201-1 uses a circuit in which two LC series resonance circuits are connected in parallel, as shown in FIG. 9.

Figure 10:
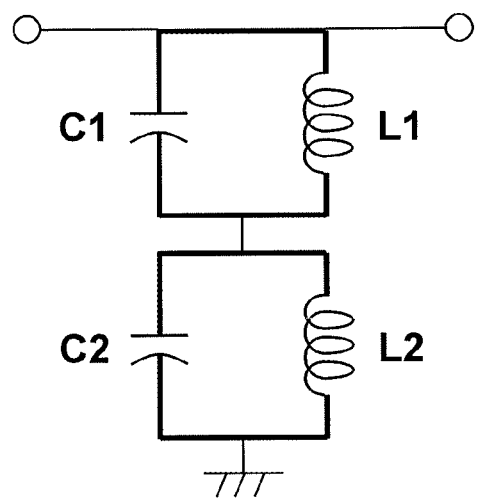
FIG. 10 shows an example of the configuration of a filter of the first exemplary embodiment of the present invention.

In addition, in the case of Modification 3, as in Modifications 1 and 2, a filter is provided in the section following open stub 206-1 (a section preceding or following synthesis point X) and this filter can be expanded to two bands. In this case, this filter uses a circuit in which two LC parallel resonance circuits are connected in series, as shown in FIG. 10.

In the case of Modification 3, the output signals of switch-mode amplifiers 100-1 and 100-2 can be synthesized for each of two frequencies. The effects are otherwise the same as for FIG. 2.

(1-4) Modification 4

Modification 4 is also an example in which quarter-wave transmission-line transformer 202-1 shown in FIG. 2 is expanded for two bands to support two frequencies.

Figure 11:
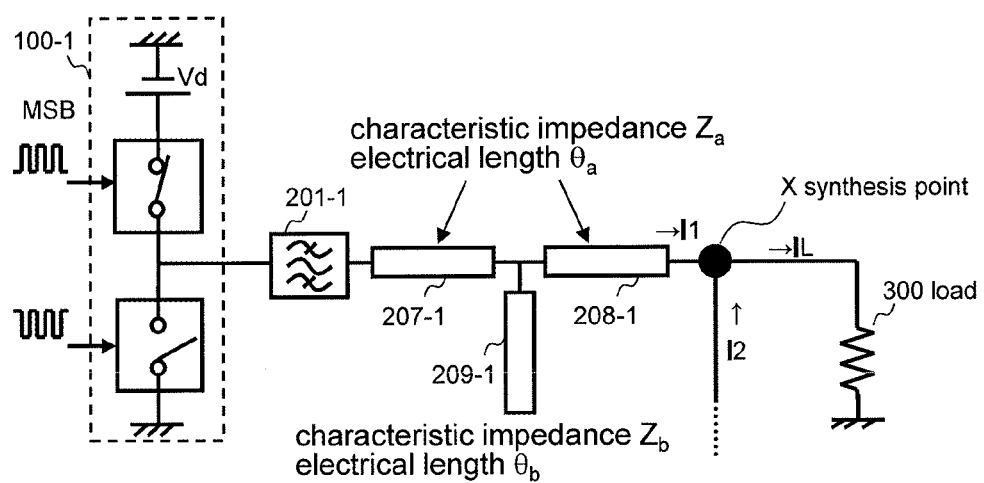
FIG. 11 shows the configuration of Modification 4 of the signal-synthesizing circuit of the first exemplary embodiment of the present invention.

FIG. 11 shows the configuration of Modification 4 of signal-synthesizing circuit 200 of the present exemplary embodiment.

As shown in FIG. 11, Modification 4 provides transmission lines 207-1 and 208-1 and open stub 209-1 as an equivalent circuit for a case of expanding quarter-wave transmission-line transformer 202-1 of FIG. 2 for two bands. In the case of this configuration, the voltage-current conversion unit is constituted by transmission lines 207-1 and 208-1 and open stub 209-1.

To state in greater detail, in the case of Modification 4, transmission lines 207-1 and 208-1 are connected in series to the signal path, and open stub 209-1 is connected in parallel to the signal path between transmission lines 207-1 and 208-1.

In the case of Modification 4, transmission lines 207-1 and 208-1 have characteristic impedance $Z_a$ and electrical length $\theta_a$, and open stub 209-1 have characteristic impedance $Z_b$ and electrical length $\theta_b$, these constants $Z_a$, $\theta_a$, $Z_b$, and $\theta_b$ being set to carry out voltage-current conversion at two frequencies.

In the case of Modification 4, the position and configuration of filter 201-1 can be made the same as described in Modification 3.

In the case of Modification 4, the output signals of each of switch-mode amplifiers 100-1 and 100-2 can be synthesized for each of two frequencies. The effects are otherwise the same as for FIG. 2.

(1-5) Modification 5

Modification 5 is also an example in which quarter-wave transmission-line transformer 202-1 shown in FIG. 2 has been expanded for two bands to support two frequencies.

Figure 12:
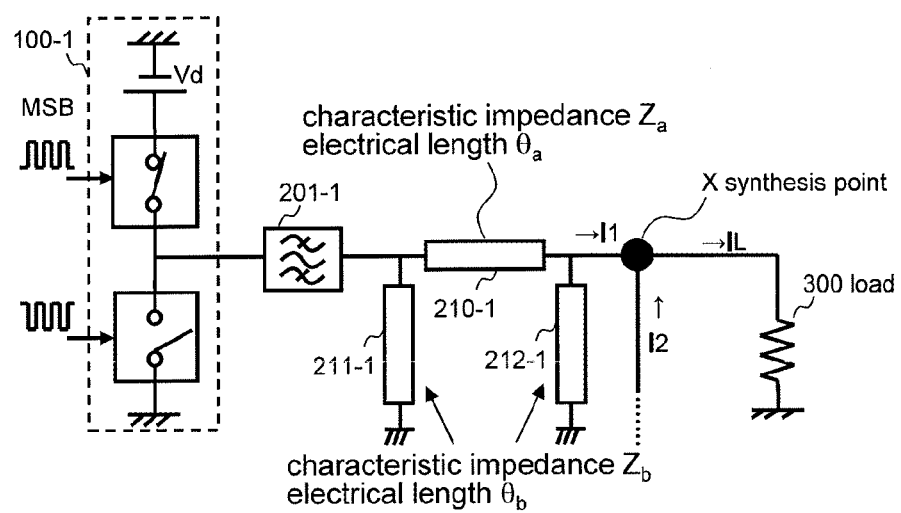
FIG. 12 shows the configuration of Modification 5 of the signal-synthesizing circuit of the first exemplary embodiment of the present invention.

FIG. 12 shows the configuration of Modification 5 of signal-synthesizing circuit 200 of the present exemplary embodiment.

As shown in FIG. 12, Modification 5 provides transmission line 210-1 and short stubs 211-1 and 212-1 as the equivalent circuit for a case in which quarter-wave transmission-line transformer 202-1 shown in FIG. 2 is expanded for two bands. In the case of this configuration, the voltage-current conversion unit is constituted by transmission line 210-1 and short stubs 211-1 and 212-1.

To state in greater detail, in the case of Modification 5, transmission line 210-1 is connected in series to the signal path and short stubs 211-1 and 212-1 are connected in parallel to the signal path, each at a respective end of the two ends of transmission line 210-1.

In the case of Modification 5, transmission line 210-1 has characteristic impedance $Z_a$ and electrical length $\theta_a$ and short stubs 211-1 and 212-1 have characteristic impedance $Z_b$ and electrical length $\theta_b$, these constants $Z_a$, $\theta_a$, $Z_b$, and $\theta_b$ being set to carry out voltage-current conversion at two frequencies.

In the case of Modification 5, the position and configuration of filter 201-1 can be made the same as described in Modification 3.

In the case of Modification 5, the output signals of switch-mode amplifiers 100-1 and 100-2 can be synthesized for each of two frequencies. The effects are otherwise the same as in FIG. 2.

(1-6) Modification 6

Modification 6 is also an example in which quarter-wave transmission-line transformer 202-1 shown in FIG. 2 is expanded for two bands to support two frequencies.

Figure 13:
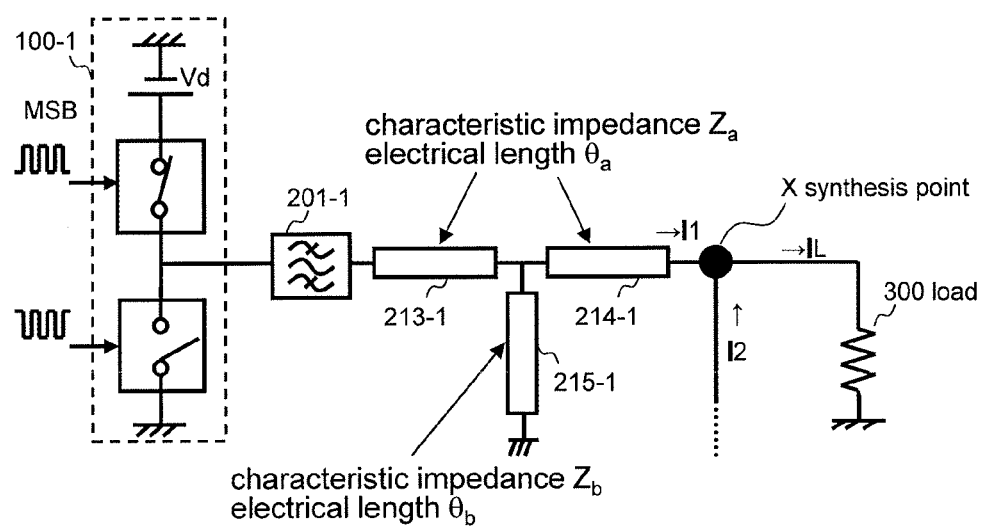
FIG. 13 shows the configuration of Modification 6 of the signal-synthesizing circuit of the first exemplary embodiment of the present invention.

FIG. 13 shows the configuration of Modification 6 of signal-synthesizing circuit 200 of the present exemplary embodiment.

As shown in FIG. 13, Modification 6 provides transmission lines 213-1 and 214-1 and short stub 215-1 as an equivalent circuit for a case in which quarter-wave transmission-line transformer 202-1 of FIG. 2 is expanded to two bands. In the case of this configuration, the voltage-current conversion unit is constituted by transmission lines 213-1 and 214-1 and short stub 215-1.

To state in greater detail, in the case of Modification 6, transmission lines 213-1 and 214-1 are connected in series to the signal path and short stub 215-1 is connected in parallel to the signal path between transmission lines 213-1 and 214-1.

In the case of Modification 6, transmission lines 213-1 and 214-1 have characteristic impedance $Z_a$ and electrical length $\theta_a$, and short stub 215-1 has characteristic impedance $Z_b$ and electrical length $\theta_b$, these constants $Z_a$, $\theta_a$, $Z_b$, and $\theta_b$ being set to carry out voltage-current conversion at two frequencies.

In the case of Modification 6, the position and configuration of filter 201-1 can be made the same as described in Modification 3.

In the case of Modification 6, the output signals of switch-mode amplifiers 100-1 and 100-2 can be synthesized for each of two frequencies. The effects are otherwise the same as for FIG. 2.

The method of designing the quarter-wave transmission-line transformers that have been expanded for two bands described in Modifications 3-6 is described in, for example, the following two documents.

Document 1:

"A Stub Tapped Branch-Line Coupler for Dual-Band Operations," IEEE Microwave and Wireless Components Letters, Vol. 17, No. 2, February 2007.

Document 2:

"Design of a Dual-Band GaN Doherty Amplifier," 18th International Conference on Microwave Radar and Wireless Communications (MIKON), 2010 Publication Year: 2010, Pages 1-4.

(2) Second Exemplary Embodiment

In contrast to the first exemplary embodiment that used a quarter-wave transmission-line transformer to constitute the voltage-current conversion unit, the present exemplary embodiment uses an LC lumped-constant circuit to constitute the voltage-current conversion unit.

The principles of the present exemplary embodiment make use of a Boucherot circuit.

A Boucherot circuit will therefore first be described.

Figure 14:
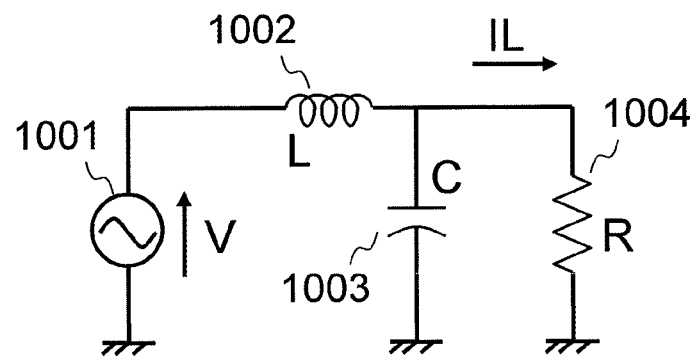
FIG. 14 is a view for explaining the principles of the signal-synthesizing circuit of the second exemplary embodiment of the present invention.

As shown in FIG. 14, a Boucherot circuit includes power source 1001, inductor 1002, capacitor 1003, and load 104.

In FIG. 14, if V is the power-source voltage of power source 1001, L is the inductance of inductor 1002, C is the capacitance of capacitor 1003, R is the resistance of load 1004, and IL is the current flowing in load 1004, the current IL is represented as shown below. Here, the symbol "//" represents the impedance of the parallel connection (the symbol is similarly used hereinbelow).

$$IL = \frac{1}{R} \cdot \frac{\left(\frac{1}{j\omega C}//R\right)}{\left(\frac{1}{j\omega C}//R\right) + j\omega L} \cdot V \quad \text{[Equation 1]}$$

When $LC=1/(\omega^2)$ (i.e., when $\omega=\omega_0$), current IL becomes $IL=V/(j\omega L)$ regardless of the size of R of load 1004.

As a result, when $LC=1/\{(\omega_0)^{\wedge}2\}$ the circuit of FIG. 14 becomes equivalent to a circuit in which a current source having a magnitude of IL is connected to load 1004.

Figure 15:
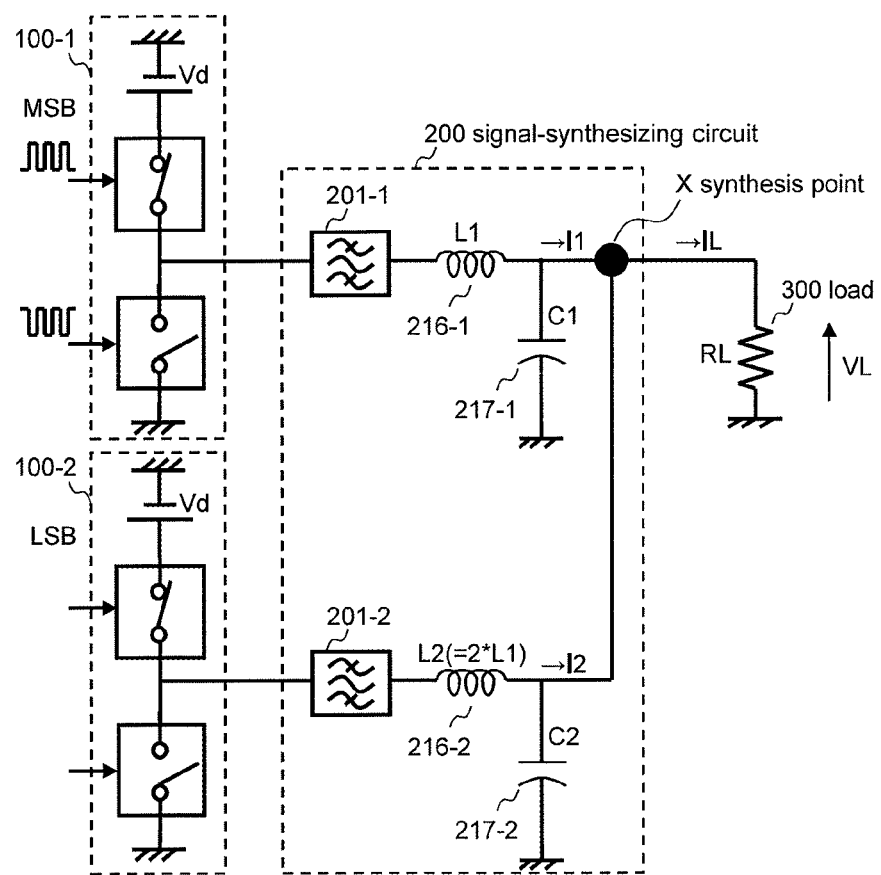
FIG. 15 shows the basic configuration of the signal-synthesizing circuit of the second exemplary embodiment of the present invention.

FIG. 15 shows the basic configuration of signal-synthesizing circuit 200 of the present exemplary embodiment.

As shown in FIG. 15, compared to the configuration of FIG. 2, signal-synthesizing circuit 200 of the present exemplary embodiment both provides inductor 216-1 and capacitor 217-1 in place of quarter-wave transmission-line transformer 202-1 and provides inductor 216-2 and capacitor 217-2 in place of quarter-wave transmission-line transformer 202-2. In the case of this configuration, a voltage-current conversion unit is constituted by inductor 216-1 and capacitor 217-1, and a voltage-current conversion unit is constituted by inductor 216-2 and capacitor 217-2.

To state in greater detail, in the signal path between switch-mode amplifier 100-1 and synthesis point X, inductor 216-1 is connected in series to the signal path and capacitor 217-1 is connected in parallel to the signal path in the section following inductor 216-1.

Further, in the signal path between switch-mode amplifier 100-2 and synthesis point X, inductor 216-2 is connected in series to the signal path and capacitor 217-2 is connected in parallel to the signal path in the section that follows inductor 216-2.

In FIG. 15, the inductances of inductors 216-1 and 216-2 are L1 and L2, respectively, and the capacitances of capacitors 217-1 and 217-2 are C1 and C2, respectively. Thus, in signal-synthesizing circuit 200 of the present exemplary embodiment, the current I1 on the MSB side is in a proportional relation with $Vd/(j \cdot \omega \cdot L1)$ when $L1 \cdot C1 = L2 \cdot C2 = 1/\{(\omega_0)^2\}$ due to the principles of the above-described Boucherot circuit. In addition, current I2 of the LSB side is in a proportional relation with $Vd/(j \cdot \omega \cdot L2)$.

Here, as the conversion coefficient when carrying out voltage-current conversion from voltage to current, the inductances L1 and L2 of inductors 216-1 and 216-2 differ from each other and are weighted according to the corresponding bit.

More specifically, in FIG. 15, the inductance of inductor 216-1 is set to L1 and the inductance L2 of inductor 216-2 is set to $L2 = 2 \cdot L1$.

Accordingly, currents I1 and I2 are weighted according to bit by inductances L1 and L2 of inductors 216-1 and 216-2. As a result, the desired voltage-synthesized waveform is obtained by supplying current IL realized by current-synthesizing these currents I1 and I2 at synthesis point X to load 300.

More specifically, the voltage VL at load 300 can be represented as shown below.

$$VL = IL \cdot RL = (I1+I2) \cdot RL = (1+\tfrac{1}{2})I1 \cdot RL \propto (1+\tfrac{1}{2}) \cdot Vd \quad \text{[Equation 2]}$$

Based on the explanation above, two-bit voltage logic synthesis becomes possible, whereby multi-bit transmission signals can be synthesized at radio frequencies.

In addition, the power-source voltages of switch-mode amplifiers 100-1 and 100-2 can be of the same type, thereby enabling a simplification and cost reduction of the power source circuit.

As in the first exemplary embodiment, when a quarter-wave transmission-line transformer is used, the concern arises that the size of the circuit will increase at frequencies that have longer wavelengths.

In contrast, the present exemplary embodiment is able to achieve a further simplification of the circuit and lower cost than the first exemplary embodiment through the use of an LC lumped-constant circuit.

In addition, signals other than the fundamental wave are reflected by filters 201-1 and 201-2 and are therefore not transmitted to load 300. As a result, higher efficiency of the transmission amplifier can be achieved. Still further, the harmonic is attenuated when viewed from load 300, whereby the spurious characteristics can be improved.

The impedance of the section preceding synthesis point X is established when the switch elements of switch-mode amplifiers 100-1 and 100-2 are turned ON/OFF, and because the impedance is low for high frequencies and can be considered as the voltage source at the outputs of switch-mode amplifiers 100-1 and 100-2 regardless of the state of the switch elements, signal-synthesizing circuit 200 is equivalent to a circuit in which the current source of current I1 and the current source of current I2 are connected at synthesis point X due to the voltage-current conversion action of the Boucherot circuit that is connected to the following section. As a result, isolation from other ports can be achieved at each port of synthesis point X.

Although the digital transmission signal was assumed to be of two bits in the present exemplary embodiment, the present invention is not limited to this form and can be applied to a multi-bit digital transmission signal.

Table 3 shows an example of settings of inductance L of each inductor 216 for a multi-bit digital transmission signal when the power-source voltages of switch-mode amplifiers 100 are all the same and inductance L of inductor 216 that corresponds to the MSB is made reference L1.

TABLE 3

| Number of bits | MSB | | | | | LSB |
|---|---|---|---|---|---|---|
| 2 bits | L1 | absent | absent | absent | absent | 2 * L1 |
| 3 bits | L1 | absent | absent | absent | 2 * L1 | 4 * L1 |
| 4 bits | L1 | absent | absent | 2 * L1 | 4 * L1 | 8 * L1 |
| 5 bits | L1 | absent | 2 * L1 | 4 * L1 | 8 * L1 | 16 * L1 |
| 6 bits | L1 | 2 * L1 | 4 * L1 | 8 * L1 | 16 * L1 | 32 * L1 |
| n bits | L1 | 2 * L1 | omitted | omitted | $2^{\wedge}(n-2)$ * L1 | $2^{\wedge}(n-1)$ * L1 |

Table 4 shows an example of settings when inductance L of inductor 216 that corresponds to the LSB is made reference L1.

TABLE 4

| Number of bits | MSB | | | | | LSB |
|---|---|---|---|---|---|---|
| 2 bits | L1/2 | absent | absent | absent | absent | L1 |
| 3 bits | L1/4 | absent | absent | absent | L1/2 | L1 |
| 4 bits | L1/8 | absent | absent | L1/4 | L1/2 | L1 |
| 5 bits | L1/16 | absent | L1/8 | L1/4 | L1/2 | L1 |
| 6 bits | L1/32 | L1/16 | L1/8 | L1/4 | L1/2 | L1 |
| n bits | L1/[2^(n−1)] | L1/[2^(n−2)] | omitted | omitted | L1/2 | L1 |

Tables 3 and 4 are examples in which inductance L of each inductor 216 is set to binary divisions, i.e., to equal divisions, but the present invention is not limited to this form, and the inductance can also be set to unequal divisions. In such cases, suitable division widths should be selected as appropriate according to the method of coding the transmission signal, the signal format, or statistical properties, but typically, L is set to increase in accordance with less significant bits.

Signal-synthesizing circuit 200 of the present exemplary embodiment is not limited to the configuration of FIG. 15 and is open to various modifications. Examples of modifications of signal-synthesizing circuit 200 of the present exemplary embodiment are next shown.

(2-1) Modification 1

Figure 16:
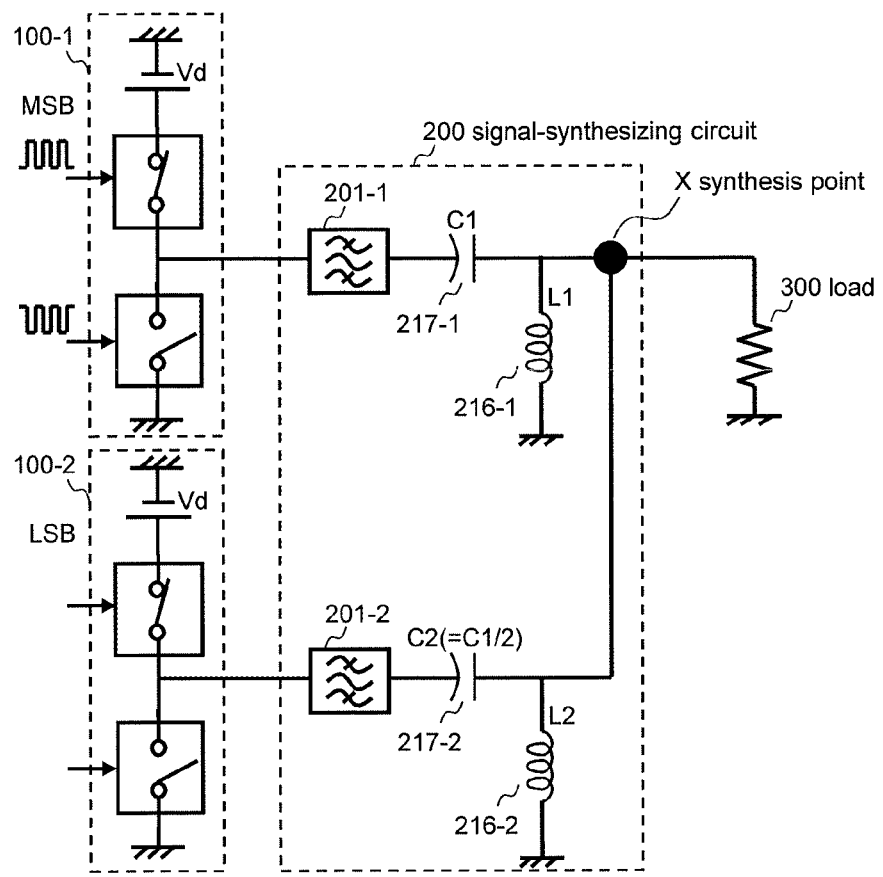
FIG. 16 shows the configuration of Modification 1 of the signal-synthesizing circuit of the second exemplary embodiment of the present invention.

FIG. 16 shows the configuration of Modification 1 of signal-synthesizing circuit 200 of the present exemplary embodiment.

As shown in FIG. 16, compared to the configuration of FIG. 15, Modification 1 both exchanges the positions of inductor 216-1 and capacitor 217-1 and exchanges the positions of inductor 216-2 and capacitor 217-2.

The principles of Modification 1 are the same as the principles of the above-described Boucherot circuit.

Figure 17:
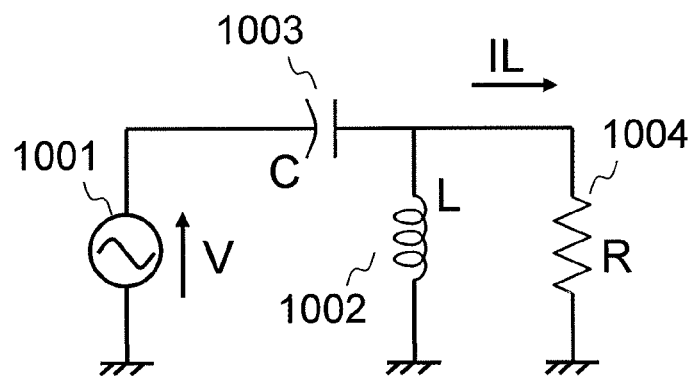
FIG. 17 is a view for explaining the principles of Modification 1 of the signal-synthesizing circuit of the second exemplary embodiment of the present invention.

A circuit is here considered in which, with respect to the configuration of FIG. 14, the positions of inductor 1002 and capacitor 1003 are exchanged, as shown in FIG. 17.

In the case of FIG. 17, current IL that flows through load 1004 can be represented as shown below.

$$IL = \frac{1}{R} \cdot \frac{(j\omega L//R)}{(j\omega L//R) + \frac{1}{j\omega C}} \cdot V \quad \text{[Equation 3]}$$

When $LC = 1/(\omega^2)$ (i.e., when $\omega = \omega_0$), current IL becomes $IL = j\omega C \cdot V$ regardless of the magnitude of R of load 1004.

Thus, when $LC = 1/\{(\omega_0)^2\}$, the circuit of FIG. 17 is equivalent to a circuit in which a current source having a magnitude of IL is connected to load 1004.

Based on the explanation above, in FIG. 16, if the inductances of inductors 216-1 and 216-2 are set to L1 and L2, respectively, and the capacitances of capacitors 217-1 and 217-2 are set to C1 and C2, respectively, the current I1 of the MSB side in the case of Modification 1 is in a proportional relation with $j \cdot \omega \cdot C1 \cdot Vd$ when $L1 \cdot C1 = L2 \cdot C2 = 1/\{(\omega_0)^2\}$. In addition, the current I2 of the LSB side is in a proportional relation with $j \cdot \omega \cdot C2 \cdot Vd$.

As a result, in the case of Modification 1, the desired voltage-synthesized waveform is obtained by making the capacitances C1 and C2 of capacitors 217-1 and 217-2 different from each other as the conversion coefficient when carrying out the voltage-current conversion from voltage to current and then carrying out weighting of the signal of each bit. For example, in FIG. 16, the capacitance of capacitor 217-1 is set to C1 and the capacitance C2 of capacitor 217-2 is set to C2=C1/2.

As shown in Table 3 and Table 4, the capacitances C of capacitors 217 that correspond to a multi-bit digital transmission signal can be set in binary divisions, i.e., in equal divisions, or can be set to unequal divisions. In such cases as well, C is set to decrease in accordance with less significant bits.

In the case of Modification 1, signals other than the fundamental wave are reflected by filters 201-1 and 201-2 and signals other than the fundamental wave are therefore not transmitted to load 300. As a result, not only can higher efficiency of the transmission amplifier be achieved, but the spurious characteristics can also be improved. The effects are otherwise the same as FIG. 15.

(2-2) Modification 2

Modification 2 is an example in which the LC lumped-constant circuit shown in FIG. 15 is expanded for two bands corresponding to two frequencies.

The principles of Modification 2 are the same as the principles of the Boucherot circuit described hereinabove.

Figure 18:
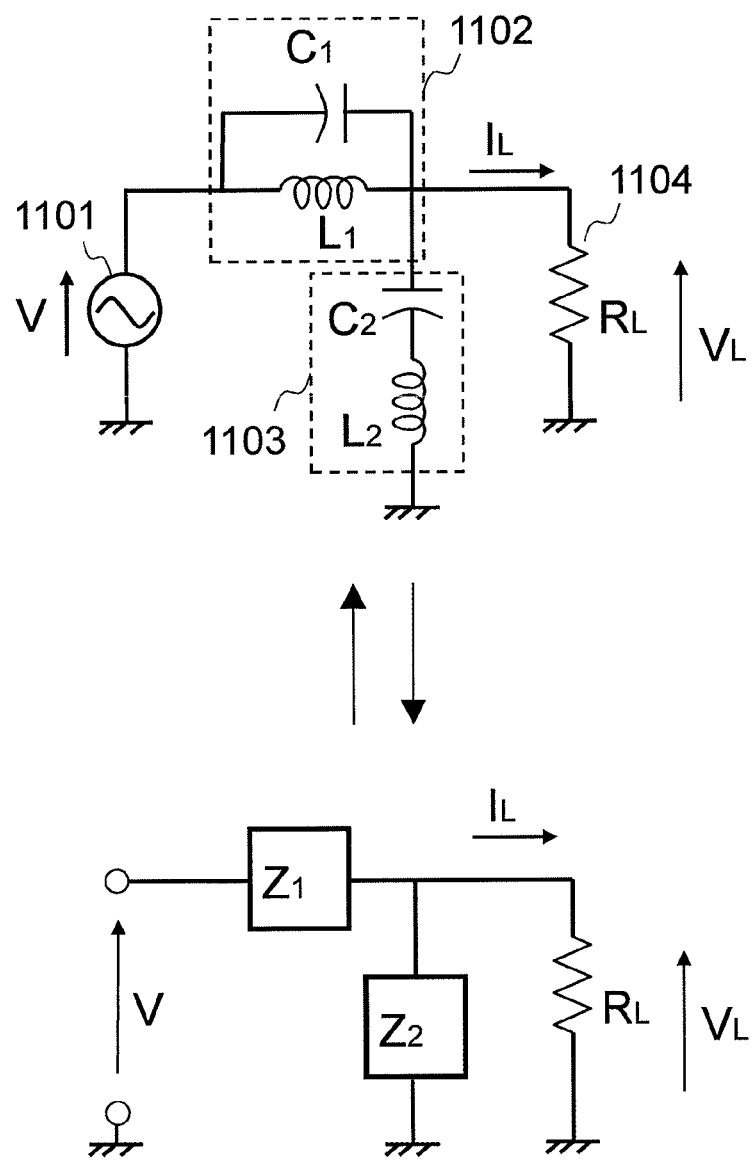
FIG. 18 is a view for explaining the principles of Modification 2 of the signal-synthesizing circuit of the second exemplary embodiment of the present invention.

A circuit is here considered that includes power source 1101, LC parallel resonance circuit 1102, LC series resonance circuit 1103, and load 1104 as shown in FIG. 18.

In FIG. 18, if V is the power-source voltage of power source 1001, $L_1$ is the inductance of the inductor that makes up LC parallel resonance circuit 1102, $C_1$ is the capacitance of the capacitor, $Z_1$ is the impedance of the entire LC parallel resonance circuit 1102, $L_2$ is the inductance of the inductor that makes up LC series resonance circuit 1103, $C_2$ is the capacitance of the capacitor, $Z_2$ is the impedance of the entire LC series resonance circuit 1103, $R_L$ is the resistance of load 1104, and $I_L$ is the current that flows through load 1104, current $I_L$ is represented as shown below.

$$I_L = \frac{1}{R_L} \cdot \frac{(Z_2//R_L)}{(Z_2//R_L) + Z_1} \cdot V \quad \text{[Equation 4]}$$

$$= \cdots = \frac{1}{\left( R_L + \frac{sL_1 \cdot \left(1 + \frac{s^2}{\omega_2^2} + sC_2 R_L\right)}{\left(1 + \frac{s^2}{\omega_1^2}\right) \cdot \left(1 + \frac{s^2}{\omega_2^2}\right)} \right)} \cdot V$$

$$= \frac{1}{R_L\left(1 + \frac{\frac{s^2}{\omega_{12}^2}}{\left(1 + \frac{s^2}{\omega_1^2}\right) \cdot \left(1 + \frac{s^2}{\omega_2^2}\right)}\right) + \frac{sL_1}{\left(1 + \frac{s^2}{\omega_1^2}\right)}} \cdot V$$

Here, because s is a Laplace operator ($=j \cdot \omega$), in the interest of simplification:

$$\omega_1^2 \equiv \frac{1}{L_1 C_1}, \ \omega_2^2 \equiv \frac{1}{L_2 C_2}, \ \omega_{12}^2 \equiv \frac{1}{L_1 C_2}, \ \omega_{21}^2 \equiv \frac{1}{L_2 C_1} \quad \text{[Equation 5]}$$

is posited (the same as in FIG. 20, below).

If the value within the parentheses ( ) of the first term of the denominator of Equation 4 is "0," Equation 4 does not depend on resistance $R_L$ of load 1104. The value of ω is sought such that the value in the parentheses ( ) of the first term of the denominator of Equation 4 is "0." At this time, two values are found as ω.

When ω is the frequency of either of the above-described two values that were found, Equation 4 can be represented as shown below.

$$I_L = \frac{\left(1 - \frac{\omega^2}{\omega_1^2}\right)}{j\omega L_1} \cdot V \quad \text{[Equation 6]}$$

Accordingly, current IL is a value that does not depend on $R_L$ of load 1104, and the circuit of FIG. 18 becomes equivalent to a circuit in which a current source of a magnitude of $I_L$ is connected to load 1104.

Figure 19:
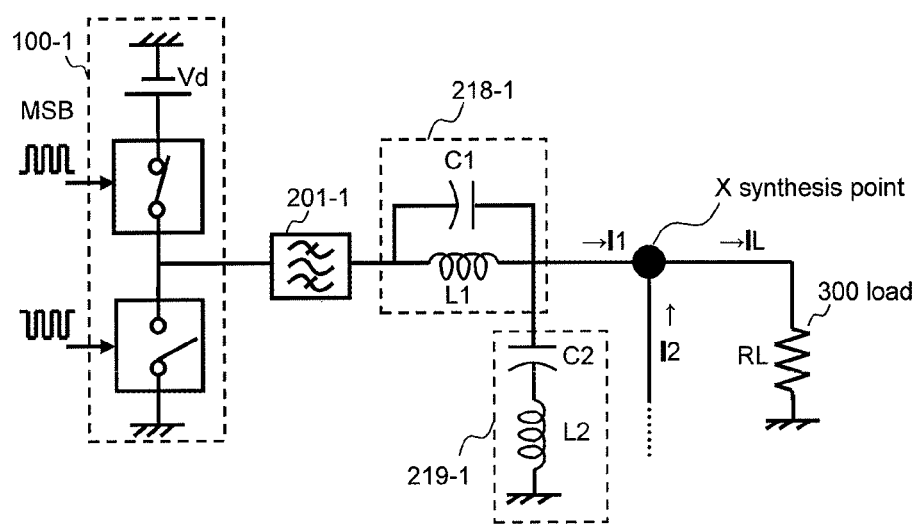
FIG. 19 shows the configuration of Modification 2 of the signal-synthesizing circuit of the second exemplary embodiment of the present invention.

FIG. 19 shows the configuration of Modification 2 of signal-synthesizing circuit 200 of the present exemplary embodiment. Although FIG. 19 shows only the configuration of the MSB side, the configuration of the LSB side is the same (the same as in FIG. 21 below).

As shown in FIG. 19, compared to the configuration of FIG. 15, Modification 2 both provides LC parallel resonance circuit 218-1 in place of inductor 216-1 and provides LC series resonance circuit 219-1 in place of capacitor 217-1. In the case of this configuration, the voltage-current conversion unit is constituted by LC parallel resonance circuit 218-1 and LC series resonance circuit 219-1.

To state in greater detail, in the signal path between switch-mode amplifier 100-1 and synthesis point X, LC parallel resonance circuit 218-1 is connected in a series to the signal path and LC series resonance circuit 219-1 is connected in parallel to the signal path in the section following LC parallel resonance circuit 218-1.

Due to the principles of a Boucherot circuit described hereinabove, at the two frequencies, current I1 of the MSB side and current I2 of the LSB side are values that do not depend on $R_L$ of load 300.

Currents I1 and I2 can then be current-synthesized at synthesis point X by setting the impedances of LC parallel resonance circuit 218-1 and LC series resonance circuit 219-1 so as to carry out voltage-current conversion at the two frequencies and making $\omega_1 \cdot \omega_2 = (\omega_0)^2$.

Thus, in the case of Modification 2, the output signals of switch-mode amplifiers 100-1 and 100-2 can be synthesized for each of two frequencies. The effects are otherwise the same as in FIG. 15.

(2-3) Modification 3

Modification 3 is an example in which the LC lumped-constant circuit shown in FIG. 15 is expanded for two bands corresponding to two frequencies.

The principles of Modification 3 are the same as the principles of the above-described Boucherot circuit.

Figure 20:
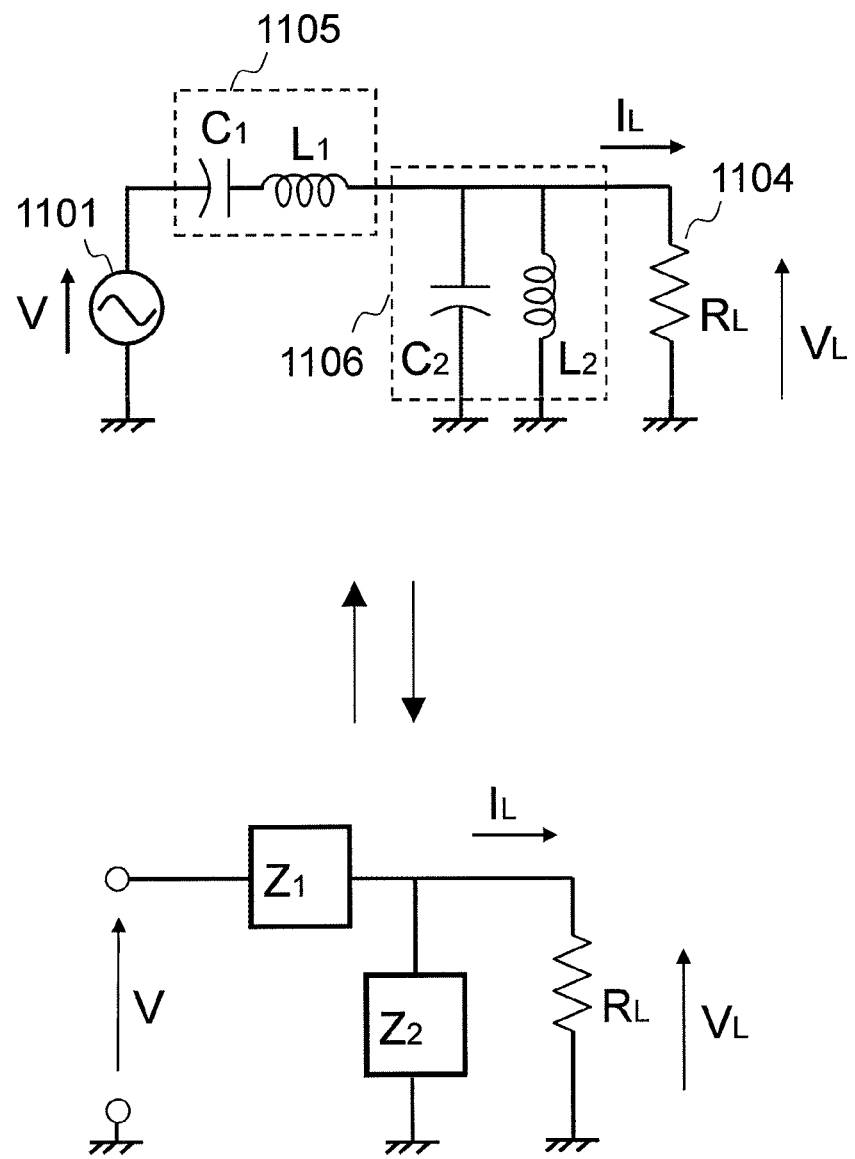
FIG. 20 is a view for explaining the principles of Modification 3 of the signal-synthesizing circuit of the second exemplary embodiment of the present invention.

A circuit is here considered that has power source 1101, LC series resonance circuit 1105, LC parallel resonance circuit 1106, and load 1104, as shown in FIG. 20.

In FIG. 20, if V is the power-source voltage of power source 1001, $L_1$ is the inductance of the inductor that makes up LC series resonance circuit 1105, $C_1$ is the capacitance of the capacitor, $Z_1$ is the impedance of the entire LC series resonance circuit 1105, $L_2$ is the inductance of the inductor that makes up LC parallel resonance circuit 1106, $C_2$ is the capacitance of the capacitor, $Z_2$ is the impedance of the entire LC parallel resonance circuit 1106, $R_L$ is the resistance of load 1104, and $I_L$ is the current that flows through load 1104, then current $I_L$ is represented as shown below.

$$I_L = \frac{1}{R_L} \cdot \frac{(Z_2 // R_L)}{(Z_2 // R_L) + Z_1} \cdot V \quad \text{[Equation 7]}$$
$$= \cdots = \frac{1}{R_L\left(1 - \left(1 + \frac{s^2}{\omega_1^2}\right)\left(1 + \frac{s^2}{\omega_2^2}\right)\right) \cdot \frac{\omega_{12}^2}{\omega^2} + \frac{1}{sC_1}\left(1 + \frac{s^2}{\omega_1^2}\right)} \cdot V$$

If the value within the parentheses ( ) of the first term of the denominator of Equation 7 is "0," then Equation 7 does not depend on resistance $R_L$ of load 1104. The value of ω is therefore sought such that the value within the parentheses ( ) of the first term of the denominator of Equation 7 becomes "0." At this time, two values are sought as ω.

When ω is the frequency of either of the two values that were sought above, Equation 7 can be represented as shown below.

$$I_L = \frac{j\omega C_1}{\left(1 - \frac{\omega^2}{\omega_1^2}\right)} \cdot V \quad \text{[Equation 8]}$$

Accordingly, current $I_L$ is a value that does not depend on $R_L$ of load 1104, and the circuit of FIG. 20 is equivalent to a circuit in which a current source of magnitude $I_L$ is connected to load 1104.

Figure 21:
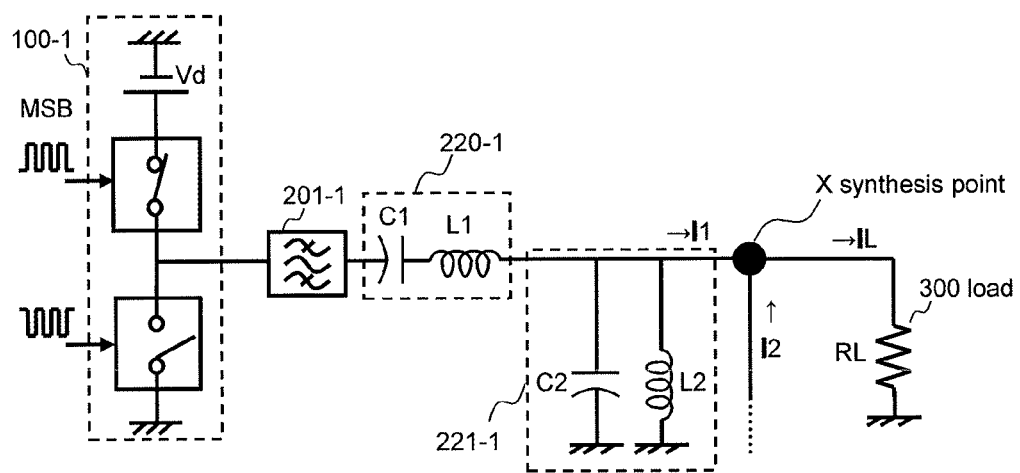
FIG. 21 shows the configuration of Modification 3 of the signal-synthesizing circuit of the second exemplary embodiment of the present invention.

FIG. 21 shows the configuration of Modification 3 of signal-synthesizing circuit 200 of the present exemplary embodiment.

As shown in FIG. 21, compared to the configuration of FIG. 15, Modification 3 both provides LC series resonance circuit 220-1 in place of inductor 216-1 and provides LC parallel resonance circuit 221-1 in place of capacitor 217-1. In the case of this configuration, the voltage-current conversion unit is constituted by LC series resonance circuit 220-1 and LC parallel resonance circuit 221-1.

To state in greater detail, in the signal path between switch-mode amplifier 100-1 and synthesis point X, LC series resonance circuit 220-1 is connected in series to the signal path, and LC parallel resonance circuit 221-1 is connected in parallel to the signal path in the section following LC series resonance circuit 220-1.

Due to the principles of the Boucherot circuit described hereinabove, at two frequencies, current I1 of the MSB side and current I2 of the LSB side are values that do not depend on $R_L$ of load 300.

At this time, currents I1 and I2 can be current-synthesized by setting the impedances of LC series resonance circuit 220-1 and LC parallel resonance circuit 221-1 so as to carry out voltage-current conversion at two frequencies and by making $\omega_1 \cdot \omega_2 = (\omega_0)^2$.

Thus, in the case of Modification 3, the output signals of switch-mode amplifiers 100-1 and 100-2 can be synthesized for each of two frequencies. The effects are otherwise the same as FIG. 15.

(2-4) Other Modifications

Signal-synthesizing circuit 200 of the present exemplary embodiment is open to various modifications other than the configuration described above.

For example, as in Modification 1 of the first exemplary embodiment, filter 201 may be provided in the section following the LC lumped-constant circuit in the signal path between synthesis point X and each switch-mode amplifier 100.

Alternatively, filter 201 may be eliminated and, in its place, filter 203 may be provided in the signal path between synthesis point X and load 300, as in Modification 2 of the first exemplary embodiment.

In the cases described above, the configuration of filter 201 can be made the same as the filter described in the first exemplary embodiment.

In the first and second exemplary embodiments described above, currents I1 and I2 are weighted by adopting a configuration such that impedance differs to weight the conversion coefficient according to the corresponding bit when carrying out voltage-current conversion from voltage to current in the voltage-current conversion unit.

(3) Third Exemplary Embodiment

In the present exemplary embodiment, currents I1 and I2 are weighted by weighting the power-source voltage of switch-mode amplifiers 100-1 and 100-2 according to the corresponding bit.

Figure 22:
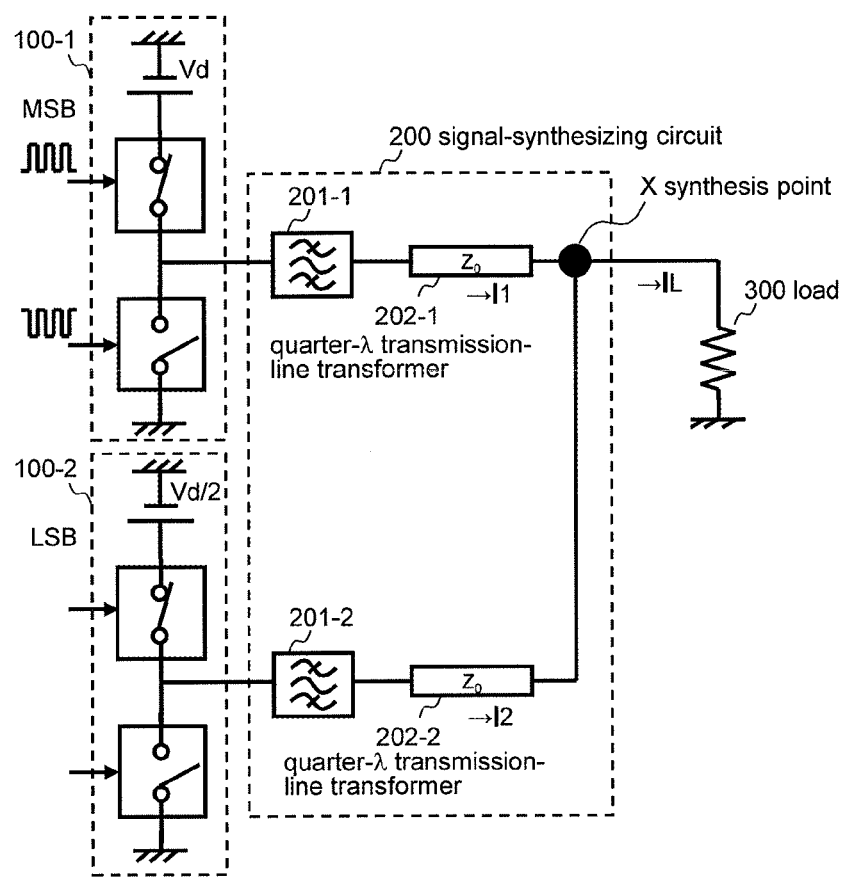
FIG. 22 shows the basic configuration of the signal-synthesizing circuit of the third exemplary embodiment of the present invention.

FIG. 22 shows the basic configuration of signal-synthesizing circuit 200 of the present exemplary embodiment.

As shown in FIG. 22, in signal-synthesizing circuit 200 of the present exemplary embodiment, the configuration itself is the same as FIG. 2.

However, in signal-synthesizing circuit 200 of the present exemplary embodiment, the voltage values of the power-source voltages of switch-mode amplifiers 100-1 and 100-2 differ from each other and are weighted according to the corresponding bits.

More specifically, in FIG. 22, the power-source voltage of switch-mode amplifier 100-1 is set to Vd, and the power-source voltage of switch-mode amplifier 100-2 is set to Vd/2.

Accordingly, currents I1 and I2 are weighted according to the bit by means of the power-source voltages of switch-mode amplifiers 100-1 and 100-2. As a result, a desired voltage-synthesized waveform is obtained by supplying to load 300 the current IL (=I1+I2) obtained by current-synthesizing these currents I1 and I2 at synthesis point X. In this way, multi-bit digital transmission signal can be synthesized at radio frequencies.

In the present exemplary embodiment, because the power-source voltages of switch-mode amplifiers 100-1 and 100-2 are caused to differ from each other, two types of power sources become necessary when the digital transmission signal is of two bits, resulting in an increase in the types of power sources compared to the first and second exemplary embodiments.

Signals other than the fundamental wave are reflected by filters 201-1 and 201-2 and are therefore not transmitted to load 300. As a result, higher efficiency of the transmission amplifier can be achieved, and further, because the harmonics are attenuated, as seen from load 300, the spurious characteristics can also be improved.

In addition, because the characteristic impedances of quarter-wave transmission-line transformers 202-1 and 202-2 can be made the same, quarter-wave transmission-line transformers 202-1 and 202-2 can be designed in common In addition, the impedance in the vicinity of the fundamental wave of the section preceding synthesis point X is established when the switch elements of switch-mode amplifiers 100-1 and 100-2 are turned ON/OFF, and the impedance at the outputs of switch-mode amplifiers 100-1 and 100-2 is low in terms of high frequencies and can be considered to be the voltage source regardless of the state of the switch elements, whereby signal-synthesizing circuit 200 is equivalent to a circuit in which the current sources of current I1 and current I2 are connected at synthesis point X due to the voltage-current conversion action of quarter-wave transmission-line transformers 202-1 and 202-2 that are connected in the following section. As a result, isolation from other ports can be obtained at each port of synthesis point X.

Although the digital transmission signal is assumed to be of two bits in the present exemplary embodiment, the present invention is not limited to this form and can be applied to a multi-bit digital transmission signal.

Here, Table 5 shows an example of the settings of the power-source voltages of each switch-mode amplifier 100 that correspond to a multi-bit digital transmission signal when the characteristic impedances of quarter-wave transmission-line transformers 202 are all made the same and the power-source voltage of switch-mode amplifier 100 that corresponds to the MSB is reference Vd.

TABLE 5

| Number of bits | MSB | | | | | LSB |
|---|---|---|---|---|---|---|
| 2 bits | Vd | absent | absent | absent | absent | Vd/2 |
| 3 bits | Vd | absent | absent | absent | Vd/2 | Vd/4 |
| 4 bits | Vd | absent | absent | Vd/2 | Vd/4 | Vd/8 |
| 5 bits | Vd | absent | Vd/2 | Vd/4 | Vd/8 | Vd/16 |
| 6 bits | Vd | Vd/2 | Vd/4 | Vd/8 | Vd/16 | Vd/32 |
| n bits | Vd | Vd/2 | omitted | omitted | $Vd/2^{(n-2)}$ | $Vd/2^{(n-1)}$ |

Explanation of an example of settings when the power-source voltage of switch-mode amplifier 100 that corresponds to the LSB is made the reference Vd, is omitted.

Although Table 5 is an example in which the power-source voltage of each switch-mode amplifier 100 is set to binary divisions, i.e., equal divisions, the present invention is not limited to this form and settings can also be made at unequal divisions. In such cases as well, suitable division widths should be selected as appropriate according to the method of coding the transmission signal, the format of the signal, and statistical properties, but typically, the power-source voltages are set to decrease with less significant bits.

Regarding signal-synthesizing circuit 200 of the present exemplary embodiment, an example has been offered of a configuration that uses the quarter-wave transmission-line transformer of the first exemplary embodiment as the voltage-current conversion unit, but signal-synthesizing circuit 200 can also be applied to a configuration in which the LC lumped-constant circuit of the second exemplary embodiment is used.

Finally, signal-synthesizing circuit 200 of the present exemplary embodiment can also be applied to the configurations of each of the modifications of the first and second exemplary embodiments.

(4) Fourth Exemplary Embodiment

In the first and second exemplary embodiments, currents I1 and I2 were weighted by weighting, according to the corresponding bit, which is the conversion coefficient when carrying out voltage-current conversion from voltage to current in the voltage-current conversion unit.

In the present exemplary embodiment, in contrast, currents I1 and I2 are weighted by weighting the thinning rate in the input signal (pulse waveform signal) of the switch-mode amplifiers 100-1 and 100-2 according to the corresponding bit.

Figure 23:
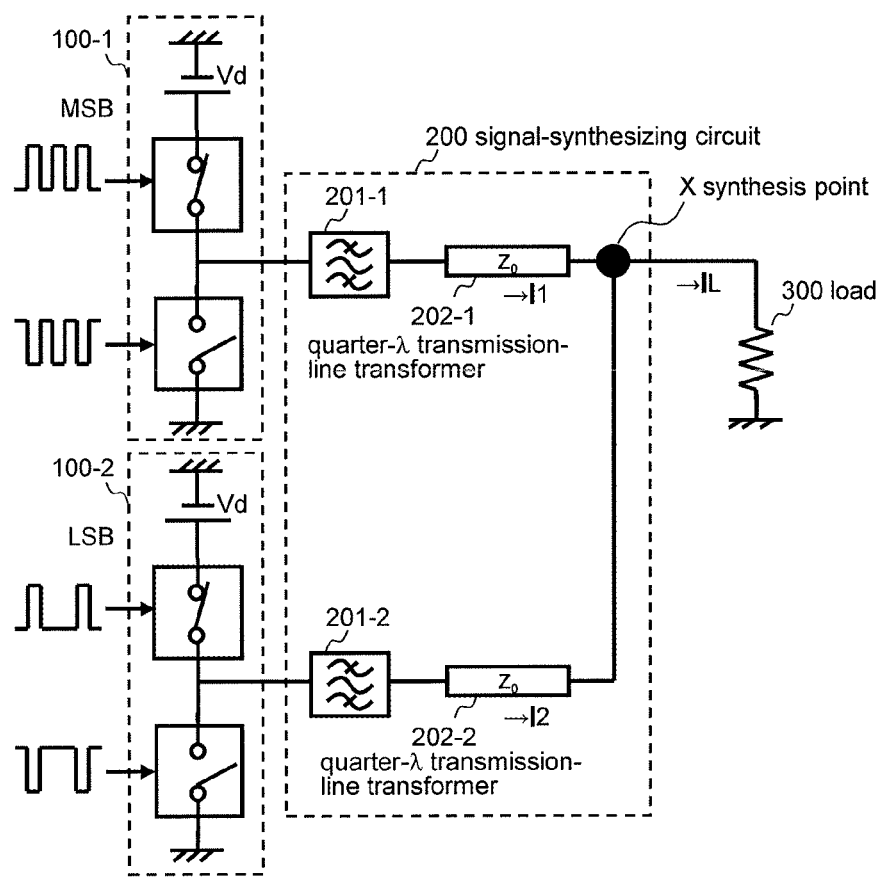
FIG. 23 shows the basic configuration of the signal-synthesizing circuit of the fourth exemplary embodiment of the present invention.

FIG. 23 shows the basic configuration of signal-synthesizing circuit 200 of the present exemplary embodiment.

As shown in FIG. 23, in signal-synthesizing circuit 200 of the present exemplary embodiment, the configuration itself is the same as FIG. 2.

However, in signal-synthesizing circuit 200 of the present exemplary embodiment, the thinning rates of the pulses in the input signals of switch-mode amplifiers 100-1 and 100-2 are different from each other and are weighted according to the corresponding bit.

More specifically, in FIG. 23, the thinning rate of the pulse in the input signal of switch-mode amplifier 100-2 is set larger than the thinning rate of the pulse in the input signal of switch-mode amplifier 100-1.

Figure 24:
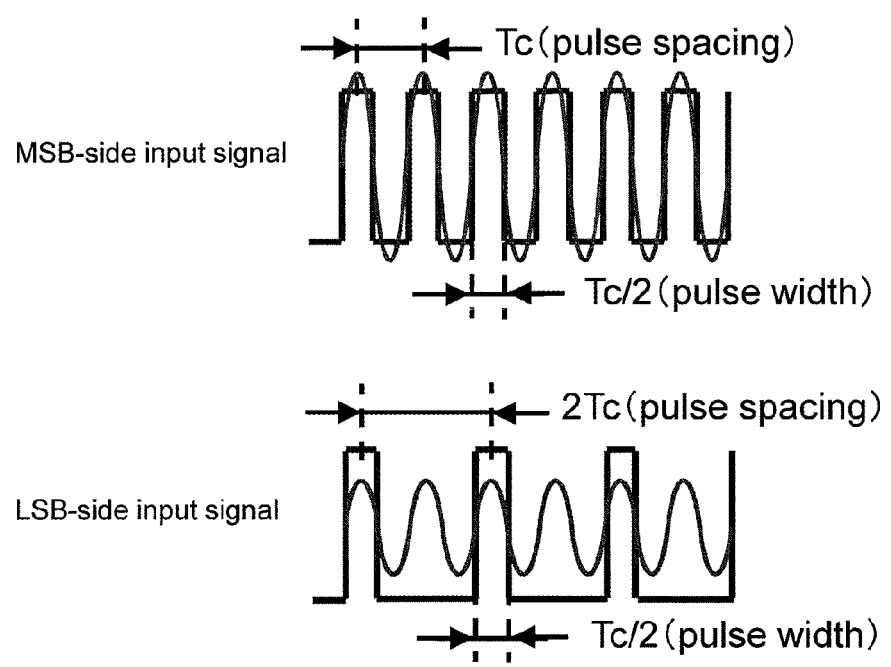
FIG. 24 is a view for explaining the pulse width and pulse spacing of pulses in the input signal of each switch-mode amplifier of the fourth exemplary embodiment of the present invention.

As shown in FIG. 24, in the present exemplary embodiment, the stipulation of the thinning rate of pulses by pulse spacing is considered. The pulse width at this time is assumed to be fixed at Tc/2. In this case, the pulse spacing of pulses in the input signal of switch-mode amplifier 100-1 is Tc, and the pulse spacing of pulses in the input signal of switch-mode amplifier 100-2 is 2*Tc.

In FIG. 24, the rectangular waves represent the waveform of the pulses of the input signal, and the sine waves represent the waveform of the desired frequency component contained in the pulses. Focusing on the waveform of the desired frequency component, it can be seen that the amplitude changes according to the pulse spacing (i.e., the thinning rate) and is weighted.

Accordingly, currents I1 and I2 are weighted according to the bit by the thinning rate of pulses in the input signals of switch-mode amplifiers 100-1 and 100-2. As a result, by supplying to load 300 the current IL (=I1+I2) that is obtained by current-synthesizing these currents I1 and I2 at synthesis point X, the desired voltage-synthesized waveform is obtained. In this way, a multi-bit digital transmission signal can be synthesized at a radio frequency.

In addition, because the power-source voltages of switch-mode amplifiers 100-1 and 100-2 can be made the same type, simplification and lower cost of the power supply circuits can be achieved.

Because the characteristic impedances of quarter-wave transmission-line transformers 202-1 and 202-2 can be made the same, quarter-wave transmission-line transformers 202-1 and 202-2 can share the same design.

Signals other than the fundamental wave are reflected at filters 201-1 and 201-2 and are therefore not transmitted to load 300. As a result, higher efficiency of the transmission amplifier can be achieved. In addition, because harmonics are attenuated, as seen from load 300, the spurious characteristics can be improved.

In addition, because impedance in the vicinity of the fundamental wave in the section preceding synthesis point X is established at the time of turning ON/OFF the switch elements of switch-mode amplifiers 100-1 and 100-2 and impedance is low in terms of high frequency at the outputs of switch-mode amplifiers 100-1 and 100-2 regardless of the state of the switch elements and can be considered to be the voltage source, signal-synthesizing circuit 200 is equivalent to a circuit in which the current source of current I1 and the current source of current I2 are connected at synthesis point X due to the voltage-current conversion action of quarter-wave transmission-line transformers 202-1 and 202-2 that are connected to the following section. As a result, isolation from other ports can be established at each port of synthesis point X.

Although the digital transmission signal is assumed to be of two bits in the present exemplary embodiment, the present invention is not limited to this form and can be applied to a multi-bit digital transmission signal.

Figure 25:
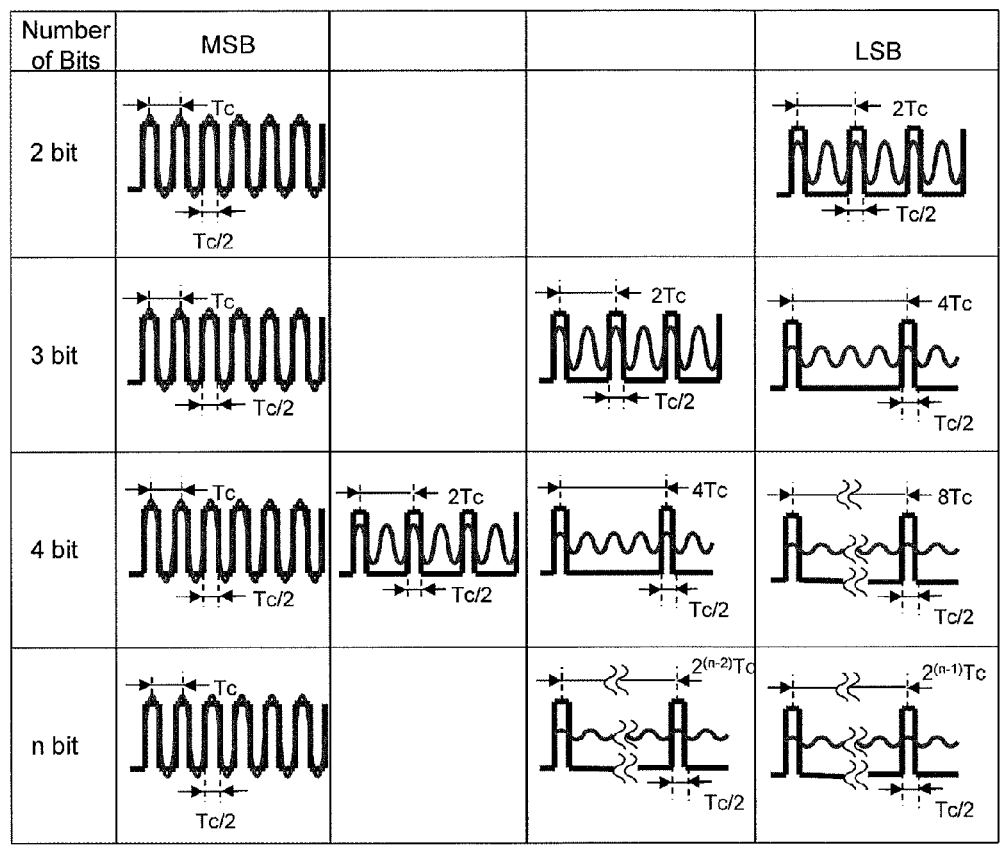
FIG. 25 is a view for describing an example of settings of the pulse spacing of pulses in the input signal of each switch-mode amplifier of the fourth exemplary embodiment of the present invention.

Table 6 shows an example of the settings of pulse spacing of pulses in the input signal of each switch-mode amplifier 100 that corresponds to a multi-bit digital transmission signal when all of the power-source voltages of switch-mode amplifiers 100 are the same, and moreover, when the characteristic impedances of quarter-wave transmission-line transformers 202 are all the same, and the pulse spacing of pulses in the input signal of switch-mode amplifier 100 that corresponds to the MSB is reference Tc. In addition, FIG. 25 shows a portion of the pulses that are set to pulse spacing as shown in Table 6.

TABLE 6

| Number of bits | MSB | | | | | LSB |
|---|---|---|---|---|---|---|
| 2 bits | Tc | absent | absent | absent | absent | 2 * Tc |
| 3 bits | Tc | absent | absent | absent | 2 * Tc | 4 * Tc |
| 4 bits | Tc | absent | absent | 2 * Tc | 4 * Tc | 8 * Tc |
| 5 bits | Tc | absent | 2 * Tc | 4 * Tc | 8 * Tc | 16 * Tc |
| 6 bits | Tc | 2 * Tc | 4 * Tc | 8 * Tc | 16 * Tc | 32 * Tc |
| n bits | Tc | 2 * Tc | omitted | omitted | $2^{(n-2)}$ * Tc | $2^{(n-1)}$ * Tc |

An explanation of an example of settings in which the pulse spacing of pulses in the input signal of switch-mode amplifier 100 that corresponds to the LSB is made reference Tc is omitted.

Although Table 6 shows an example in which the pulse spacing of pulses in the input signal of each switch-mode amplifier 100 is set to binary divisions, i.e., equal divisions, the present invention is not limited to this form and settings can be made to unequal divisions. In such cases as well, suitable division widths should be selected as appropriate according to the method of coding transmission signals, the format of signals, or statistical properties, but the pulse spacing is typically set to increase (i.e., the thinning rate increases) with less significant bits.

Although an example of the configuration of signal-synthesizing circuit 200 of the present exemplary embodiment has been presented that uses the quarter-wave transmission-line transformer of the first exemplary embodiment as the voltage-current conversion unit, the present exemplary embodiment can also be applied to a configuration that uses the LC lumped-constant circuit of the second exemplary embodiment.

Signal-synthesizing circuit 200 of the present exemplary embodiment can also be applied in the configuration of each modification of the first and second exemplary embodiments.

Although the methods of weighting currents I1 and I2 differ in the third and fourth exemplary embodiments (weighting of the power-source voltage in the third exemplary embodiment and weighting of the thinning rate of pulses in the fourth exemplary embodiment), the configuration of signal-synthesizing circuit 200 itself is the same. As a result, signal-synthesizing circuit 200 of the same design can be applied in common and can be applied to both of the weighting methods of the third and fourth exemplary embodiments. This point of contributing to the shared use of design and circuits is yet another merit of the invention.

(5) Fifth Exemplary Embodiment

The present exemplary embodiment is a modification of the fourth exemplary embodiment in which the output power of switch-mode amplifiers 100-1 and 100-2 is controlled by the thinning rate of pulses in the input signals of switch-mode amplifiers 100-1 and 100-2.

Figure 26:
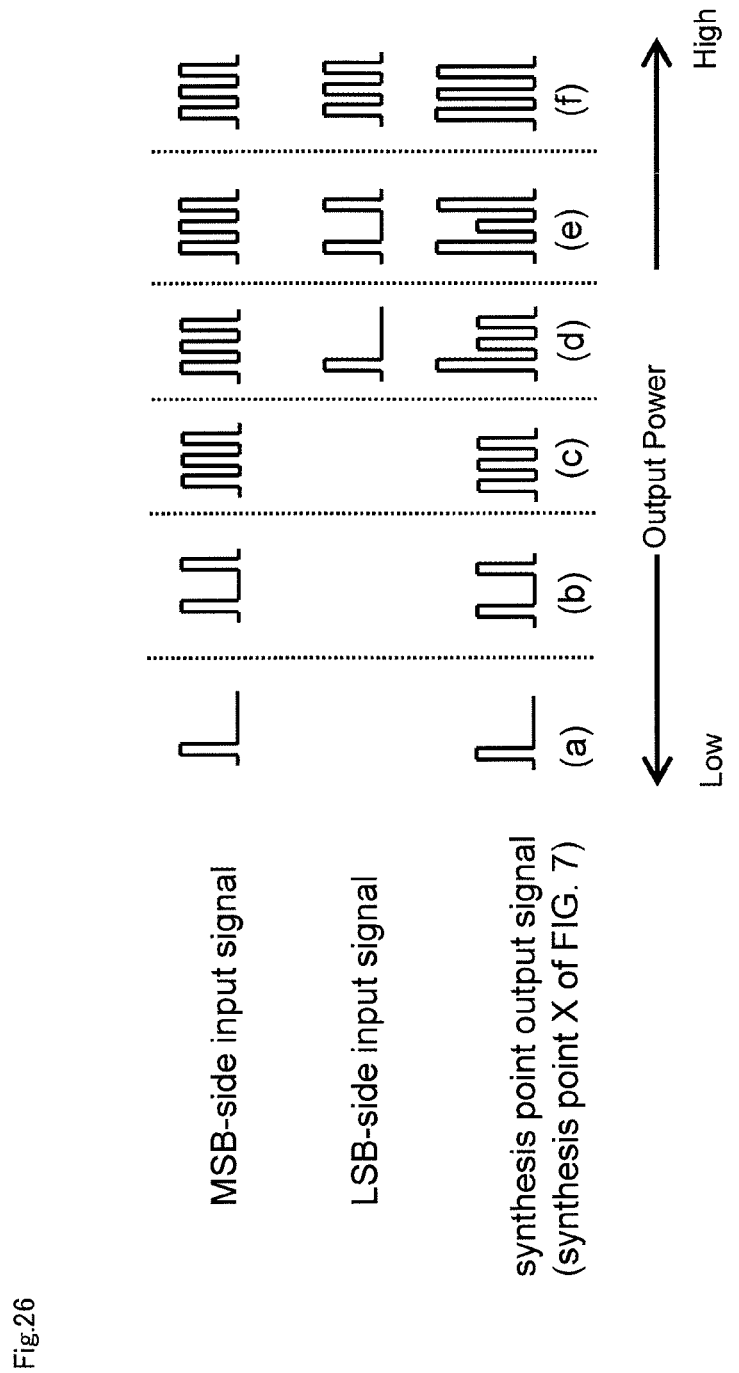
FIG. 26 is a view for describing the pulse waveform of the input signal of each switch-mode amplifier and the pulse waveform of the output signal of the synthesis point of the fifth exemplary embodiment of the present invention.

More specifically, as shown in FIG. 26, operation is divided according to the output power between a region in which pulses are applied as input only to switch-mode amplifier 100-1 of the MSB side (during low-output operation in which the output power is no greater than a predetermined value: (a)-(c) in the example of FIG. 26) and a region in which pulses are also applied as input to switch-mode amplifier 100-2 of the LSB side (during high-output operation in which the output power exceeds the predetermined value: (d)-(f) in the example of FIG. 26).

During low-output operation, the thinning rate of pulses that are applied to switch-mode amplifier 100-1 of the MSB side is controlled according to the output power (controlled such that the thinning rate decreases in proportion to increases of the output power).

On the other hand, during high-output operation, the thinning rate of pulses applied to switch-mode amplifier 100-1 of the MSB side is fixed, and the thinning rate of pulses applied to switch-mode amplifier 100-2 of the LSB side is controlled according to the output power (controlled such that the thinning rate decreases in proportion to increase of the output power).

The effect of the present exemplary embodiment is explained by offering examples of signal waveforms of two-bit synthesis at synthesis point X in the case of the configuration of FIG. 7. The output signals of switch-mode amplifiers 100-1 and 100-2 are subjected to voltage-current conversion, whereby switch-mode amplifiers 100-1 and 100-2 become equivalent to a parallel connection of independent current sources at synthesis point X, and the pulses of the output signals of switch-mode amplifiers 100-1 and 100-2 independently add to each other. As a result, shifting the timing of supply enables a variety of weightings according to each type of thinning rate, and in the example of the input signal of FIG. 26, the output pulse waveforms of FIG. 26 are obtained at synthesis point X. In the interest of making the effect of the present exemplary embodiment more easily understood, the fact that the output pulse waveforms of FIG. 26 have undergone band-restricting in filters 201-1 and 201-2 from switch-mode amplifiers 100-1 and 100-2 to synthesis point X and then are synthesized after the fundamental wave components contained in the pulses have been extracted is not shown. However, from the relation of the fundamental wave component and the pulses shown in FIG. 24 or FIG. 25, the fundamental wave shape can be obtained that follows two-bit synthesis that is contained in the output pulse waveforms of FIG. 26.

Accordingly, current I1 and I2 can be weighted in the present exemplary embodiment similarly to the fourth exemplary embodiment, whereby the same effects are obtained as in the fourth exemplary embodiment.

Figure 27:
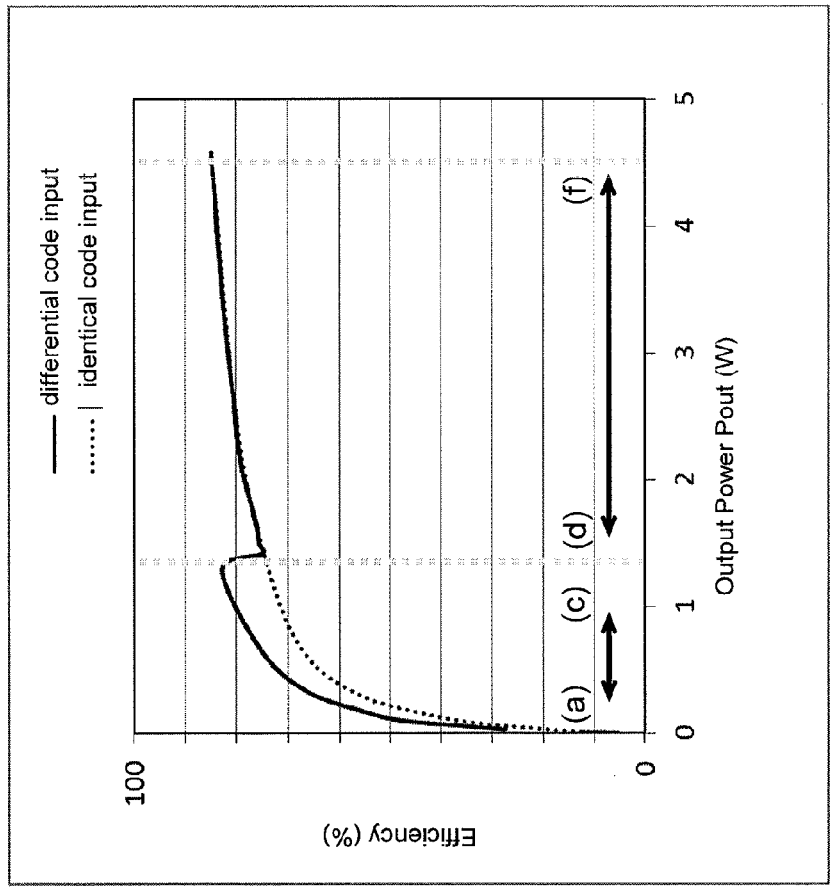
FIG. 27 is a view for describing the effects of the fifth exemplary embodiment of the present invention.

In the present exemplary embodiment, because pulses of differing thinning rates are applied as input to two switch-mode amplifiers 100-1 and 100-2 (differential code input), the effect is obtained that, as shown by the output-efficiency curve of FIG. 27, operation at higher efficiency is possible even during low-output operation (back-off operation) when compared with a configuration in which pulses of the same thinning rate are applied as input to two switch-mode amplifiers 100-1 and 100-2 (identical code input).

Figure 28:
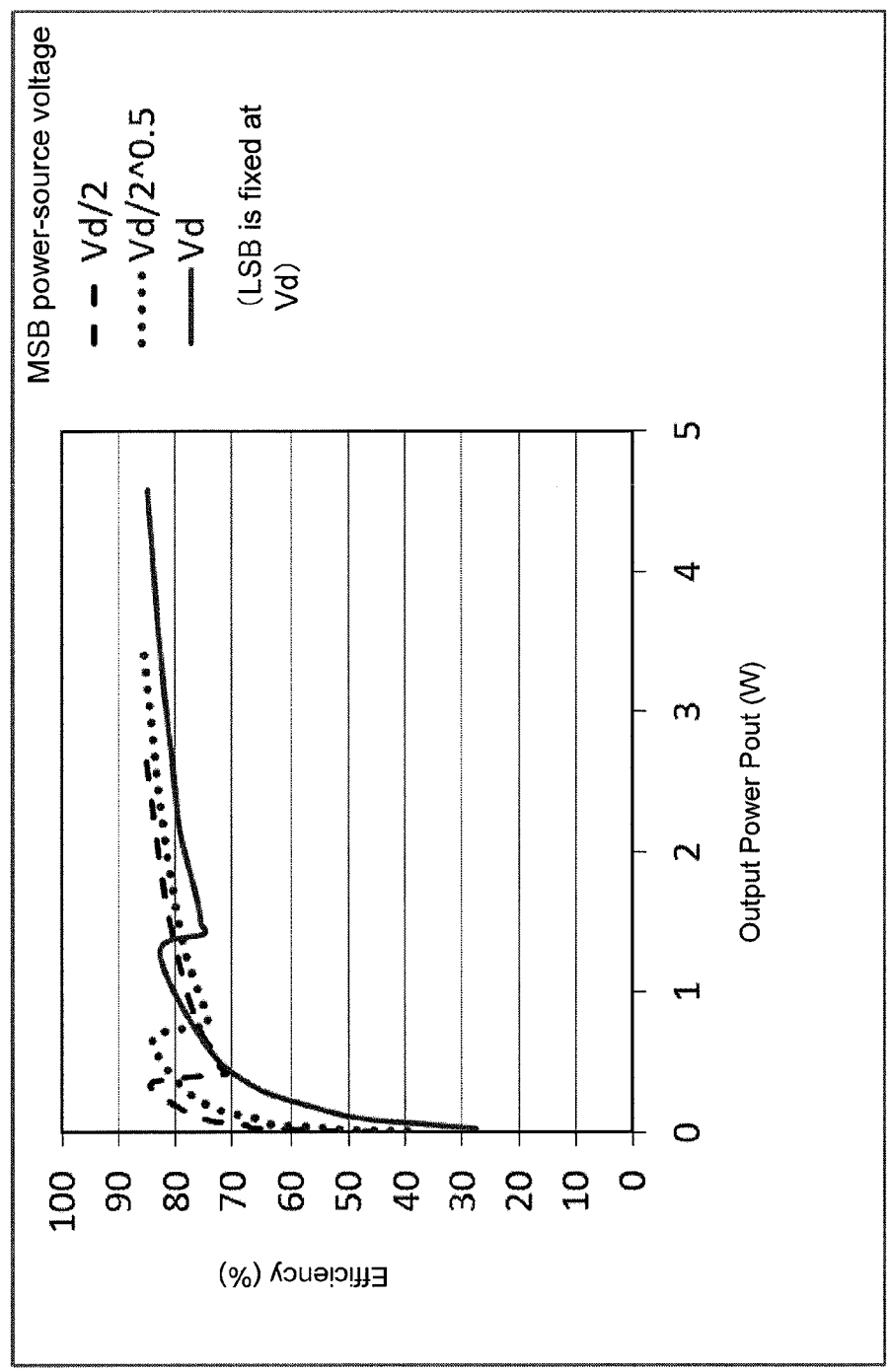
FIG. 28 is a view for describing the effects of the fifth exemplary embodiment of the present invention.

Further, the additional effect is obtained in the present exemplary embodiment that, when combined with a configuration that causes the power-source voltage to differ on the MSB side as in the third exemplary embodiment, the efficiency peak point of back-off operation can be easily controlled without necessitating physical correction such as a circuit, as shown by the output-efficiency curve of FIG. 28.

In addition, the present exemplary embodiment also enables application to a configuration such as described in the fourth exemplary embodiment (such as application to a number of bits other than two bits).

Although the present invention has been described hereinabove with reference to exemplary embodiments, the present invention is not limited to the above-described exemplary embodiments. The configuration and details of the present invention are open to various modifications within the scope of the present invention that will be clear to one of ordinary skill in the art.

For example, although the digital transmission signal was assumed to be of two bits in the above-described exemplary embodiments, the present invention is not limited to this form and can also be applied to multi-bit digital transmission signals.

Although examples were described in the exemplary embodiments hereinabove in which the voltage-current conversion unit and band-restricting unit were expanded for two bands, the present invention is not limited to this form, and by increasing the number of elements that make up the voltage-current conversion unit and band-restricting unit, this invention can also be applied to expansion to other pluralities of bands. It will also be easily understood that a signal-synthesizing circuit can be constituted by combining a quarter-wave transmission-line transformer and lumped-constant form as the voltage-current conversion unit.

Still further, in the above-described exemplary embodiments, the quarter-wave transmission-line transformers, lumped-constant elements, and further, the switch-mode amplifiers are described as components provided with ideal characteristics regarding the operation and effects of synthesizing multi-bit signals. However, due to the elements that are actually employed, compensation for the parasitic components of these components can also be implemented, and alteration of signal line configurations and element values, and further, alterations such as the addition of compensating elements for causing the phases of voltage waveform and current waveforms to more closely approach the ideal signal-synthesizing operation can also be carried out.

This application claims the benefits of priority based on Japanese Patent Application No. 2012-202591 for which application was submitted on Sep. 14, 2012 and Japanese Patent Application No. 2013-019538 for which application was submitted on Feb. 4, 2013 and incorporates by citation all of the disclosures of those applications.

EXPLANATION OF REFERENCE NUMBERS

100-1, 100-2 switch mode amplifier
200 signal-synthesizing circuit
201-1, 201-2 filter
202-1, 202-2 quarter-wave transmission line transformer
203 filter
204-1 transmission-line transformer
205-1, 206-1 open stub
207-1, 208-1 transmission-line transformer
209-1 open stub
210-1 transmission-line transformer
211-1, 212-1 short stub
213-1, 214-1 transmission-line transformer
215-1 short stub
216-1, 216-2 inductor
217-1, 217-2 capacitor 218-1 LC parallel resonance circuit
219-1 LC series resonance circuit
220-1 LC series resonance circuit
221-1 LC parallel resonance circuit
300 load
X synthesis point
410 digital baseband signal generation unit
420 modulation circuit
421 IQ modulator
422 converter
423 modulator
424 integrator
425 decoder

What is claimed is:

1. A transmitter comprising:
a modulation circuit that modulates a baseband signal into a multi-bit digital signal that contains a radio frequency band component;
a plurality of switch-mode amplifiers each provided corresponding to a respective bit of said multi-bit digital signal that is supplied from said modulation circuit; and
a signal-synthesizing circuit that connects a filter that restricts the band of output signals of said plurality of switch-mode amplifiers and a voltage-current conversion circuit that converts output signals of said switch-mode amplifiers from voltage to current to perform signal synthesizing.

2. The transmitter as set forth in claim 1, wherein differences in impedance in said voltage-current conversion circuit correspond to respective differences in each said bit.

3. The transmitter as set forth in claim 1, wherein differences in voltage values of power-source voltages of said switch-mode amplifiers correspond to respective differences in each said bit.

4. The transmitter as set forth in claim 1, wherein differences in the thinning rate of pulses in input signals of said switch-mode amplifiers correspond to respective differences in each said bit.

5. The transmitter as set forth in claim 1, wherein:
output power of said switch-mode amplifiers is controlled by the thinning rate of pulses in input signals of said switch-mode amplifiers;
when said output power is equal to or less than a predetermined value, the pulses are applied as input to only a portion of said switch-mode amplifiers and the thinning rate of the pulses applied to this portion of switch-mode amplifiers is controlled according to output power; and
when said output power surpasses a predetermined value, the thinning rate of the pulses is fixed for a portion of said switch-mode amplifiers and the thinning rate of the pulses applied to the other switch-mode amplifiers is controlled according to output power.

6. The transmitter as set forth in claim 1, wherein:
said filter and said voltage-current conversion circuit are provided on each of a plurality of first signal paths between said plurality of switch-mode amplifiers and a synthesis point; and
said filter is provided in a section that precedes said voltage-current conversion circuit and is made up of an LC series resonance circuit.

7. The transmitter as set forth in claim 1, wherein:
said filter and said voltage-current conversion circuit are provided on each of a plurality of first signal paths between said plurality of switch-mode amplifiers and a synthesis point; and
said filter is provided in a section that follows said voltage-current conversion circuit and is made up of an LC parallel resonance circuit.

8. The transmitter as set forth in claim 1, wherein:
said filter and said voltage-current conversion circuit are provided on each of a plurality of first signal paths between said plurality of switch-mode amplifiers and a synthesis point; and
said filter is provided in a section that follows said voltage-current conversion circuit and is made up of:
an LC series resonance circuit that is connected in series to said first signal path, and
an LC parallel resonance circuit and capacitor that are connected in parallel to said first signal paths in a section that precedes said LC series resonance circuit.

9. The transmitter as set forth in claim 1, wherein:
said voltage-current conversion circuit is provided on each of a plurality of first signal paths between said plurality of switch-mode amplifiers and a synthesis point;
said filter is provided on a second signal path between said synthesis point and load; and
said filter is made up of an LC parallel resonance circuit.

10. The transmitter as set forth in claim 6, wherein said voltage-current conversion circuit that converts output signals is made up of a quarter-wave transmission-line transformer that is connected in series to said first signal path.

11. The transmitter as set forth in claim 6, wherein said voltage-current conversion circuit that converts output signals is made up of:
an inductor connected in series to said first signal path; and
a capacitor connected in parallel to said first signal path in a section following said inductor.

12. The transmitter as set forth in claim 6, wherein said voltage-current conversion circuit that converts output signals is made up of:
a capacitor that is connected in series to said first signal path; and
an inductor that is connected in parallel to said first signal path in a section that follows said capacitor.

13. The transmitter as set forth in claim 1, wherein:
said filter and said-voltage-current conversion circuit are provided on each of a plurality of first signal paths between said plurality of switch-mode amplifiers and a synthesis point; and
said filter is provided in a section that precedes said voltage-current conversion circuit and is made up of a circuit in which two LC series resonance circuits are connected in parallel.

14. The transmitter as set forth in claim 1, wherein:
said filter and said voltage-current conversion circuit is provided on each of a plurality of first signal paths between said plurality of switch-mode amplifiers and a synthesis point; and
said filter is provided in a section that follows said voltage-current conversion circuit, and is made up of a circuit in which two LC parallel resonance circuits are connected in series.

15. The transmitter as set forth in claim 1, wherein:
said voltage-current conversion circuit is provided on each of a plurality of first signal paths between said plurality of switch-mode amplifiers and a synthesis point;
said filter is provided on a second signal path between said synthesis point and load; and
said filter is made up of a circuit in which two LC parallel resonance circuits are connected in series.

16. The transmitter as set forth in claim 13, wherein:
said voltage-current conversion circuit is made up of:
a transmission line connected in series to said first signal path; and
two open stubs connected in parallel to said first signal path at the two ends of said transmission line; and
a constant is set such that voltage-current conversion is carried out at different frequencies.

17. The transmitter as set forth in claim 13, wherein:
said voltage-current conversion circuit is made up of:
two transmission lines that are connected in series to said first signal path; and
an open stub that is connected in parallel to said first signal path between said two transmission lines; and
a constant is set such that voltage-current conversion is carried out at different frequencies.

18. The transmitter as set forth in claim 13, wherein:
said voltage-current conversion circuit is made up of:
a transmission line that is connected in series to said first signal path; and
two short stubs that are connected in parallel to said first signal path at the two ends of said transmission line; and
a constant is set such that voltage-current conversion is carried out at different frequencies.

19. The transmitter as set forth in claim 13, wherein:
said voltage-current conversion circuit is made up of:
two transmission lines that are connected in series to said first signal path; and
a short stub that is connected in parallel to said first signal path between said two transmission lines; and
a constant is set such that voltage-current conversion is carried out at different frequencies.

20. The transmitter as set forth in claim 13, wherein:
said voltage-current conversion circuit is made up of:
an LC parallel resonance circuit that is connected in series to said first signal path; and
an LC series resonance circuit that is connected in parallel to said first signal path in a section that follows said LC parallel resonance circuit; and
a constant is set such that voltage-current conversion is carried out at different frequencies.

21. The transmitter as set forth in claim 13, wherein:
said voltage-current conversion circuit is made up of:
an LC series resonance circuit that is connected in series to said first signal path; and
an LC parallel resonance circuit that is connected in parallel to said first signal path in a section that follows said LC series resonance circuit; and
a constant is set such that voltage-current conversion is carried out at different frequencies.

22. A signal-synthesizing circuit comprising:
a filter that restricts the band of output signals of a plurality of switch-mode amplifiers that are each provided corresponding to a respective bit of a multi-bit digital signal; and
a voltage-current conversion circuit that converts output signals of said switch-mode amplifiers from voltage to current;
wherein said filter and said voltage-current conversion circuit are connected to perform signal synthesizing.

23. The signal-synthesizing circuit as set forth in claim 22, wherein differences in impedance in said voltage-current conversion circuit correspond to respective differences in each said bit.

24. The signal-synthesizing circuit as set forth in claim 22, wherein differences in voltage values of the power-source voltages of said switch-mode amplifiers correspond to respective differences in each said bit.

25. The signal-synthesizing circuit as set forth in claim 22, wherein differences in the thinning rate of pulses in input signals of said switch-mode amplifiers correspond to respective differences in each said bit.

26. The signal-synthesizing circuit as set forth in claim 22, wherein:
the output power of said switch-mode amplifiers is controlled by the thinning rate of pulses in input signals of said switch-mode amplifiers;
when said output power is less than or equal to a predetermined value, the pulses are applied as input to only a portion of said switch-mode amplifiers and the thinning rate of the pulses applied to this portion of switch-mode amplifiers is controlled according to output power; and
when said output power surpasses a predetermined value, the thinning rate of the pulses is fixed for a portion of said switch-mode amplifiers and the thinning rate of the pulses applied to the other switch-mode amplifiers is controlled according to output power.

27. A signal-synthesizing method wherein a signal-synthesizing circuit is provided with:
a filter that restricts the band of output signals of a plurality of switch-mode amplifiers that are each provided corresponding to a respective bit of a multi-bit digital signal; and
a voltage-current conversion circuit that converts output signals of said switch-mode amplifiers from voltage to current;
wherein said signal-synthesizing circuit connects said filter and said voltage-current conversion circuit to perform signal synthesizing.

28. The signal-synthesizing method as set forth in claim 27, wherein differences in impedance in said voltage-current conversion circuit correspond to respective differences in each said bit.

29. The signal-synthesizing method as set forth in claim 27, wherein differences in voltage values of the power-source voltages of said switch-mode amplifiers correspond to respective differences in each said bit.

30. The signal-synthesizing method as set forth in claim 27, wherein differences in the thinning rate of pulses in input signals of said switch-mode amplifiers correspond to respective differences in each said bit.

31. The signal-synthesizing method as set forth in claim 27, wherein:
output power of said switch-mode amplifiers is controlled by the thinning rate of pulses in input signals of said switch-mode amplifiers;
when said output power is less than or equal to a predetermined value, the pulses are applied as input to only a portion of said switch-mode amplifiers, and the thinning rate of the pulses applied to this portion of switch-mode amplifiers is controlled according to output power; and
when said output power surpasses a predetermined value, the thinning rate of the pulses is fixed for a portion of said switch-mode amplifiers and the thinning rate of the pulses applied to the other switch-mode amplifiers is controlled according to output power.

* * * * *